United States Patent
Mandecki et al.

(10) Patent No.: US 11,943,330 B2
(45) Date of Patent: Mar. 26, 2024

(54) LIGHT-TRIGGERED TRANSPONDER

(71) Applicant: P-CHIP IP HOLDINGS INC., Chicago, IL (US)

(72) Inventors: Wlodek Mandecki, Princeton Junction, NJ (US); Von Ertwine, Upper Holland, PA (US); Young-June Yu, Cranbury, NJ (US); William E. Eibon, Elyria, OH (US); Conrad Styczen, Palatine, IL (US); Joseph Wagner, Wasco, IL (US)

(73) Assignee: P-CHIP IP HOLDINGS INC., Chicago, IL (US)

( * ) Notice: Subject to any disclaimer, the term of this patent is extended or adjusted under 35 U.S.C. 154(b) by 0 days.

(21) Appl. No.: 17/683,052

(22) Filed: Feb. 28, 2022

(65) Prior Publication Data

US 2022/0224504 A1 Jul. 14, 2022

Related U.S. Application Data

(63) Continuation of application No. 17/174,979, filed on Feb. 12, 2021, now Pat. No. 11,546,129.

(Continued)

(51) Int. Cl.
  *H04L 7/00* (2006.01)
(52) U.S. Cl.
  CPC .................. *H04L 7/0075* (2013.01)
(58) Field of Classification Search
  CPC ..... H04L 7/0075; H04L 7/0334; H04L 27/06; H04L 25/4902; H04B 5/0062

(Continued)

(56) References Cited

U.S. PATENT DOCUMENTS

| 3,817,347 A | 6/1974 | Spencer |
| 4,870,367 A | 9/1989 | Nakase et al. |

(Continued)

FOREIGN PATENT DOCUMENTS

| CN | 202226341 U | 5/2012 |
| EP | 1172759 | 1/2002 |

(Continued)

OTHER PUBLICATIONS

U.S. Appl. No. 17/174,979.

(Continued)

*Primary Examiner* — Emmanuel Bayard
(74) *Attorney, Agent, or Firm* — DLA Piper LLP (US)

(57) ABSTRACT

A light-triggered transponder includes one or more of photo cells, a clock recovery circuit and a reverse antenna system. The clock recovery circuit (CRC) includes a photoconductor with a source terminal, a drain terminal for receiving a voltage, the photoconductor resistance varying with received light intensity. The CRC is configured to generate a recovered clock. A reverse antenna system connected to at least one photo cell and configured to transmit data. The photoconductor configured to produce a modulated voltage signal from an incident modulated light incident. The CRC can include an amplifier coupled to the source terminal of the photoconductor via a capacitor for receiving the modulated voltage signal and outputting an analog signal generated from the voltage signal. The CRC can include an inverter coupled to the amplifier and configured to digitize the analog signal of the amplifier.

18 Claims, 19 Drawing Sheets

Related U.S. Application Data

(60) Provisional application No. 63/010,602, filed on Apr. 15, 2020, provisional application No. 62/976,684, filed on Feb. 14, 2020.

(58) Field of Classification Search
USPC .................................................. 375/219, 354
See application file for complete search history.

(56) References Cited

U.S. PATENT DOCUMENTS

| | | | |
|---|---|---|---|
| 4,905,445 A | 3/1990 | Saitoh | |
| 5,484,403 A | 1/1996 | Yoakum et al. | |
| 5,510,769 A | 4/1996 | Kajfez et al. | |
| 5,641,634 A | 6/1997 | Mandecki | |
| 5,771,002 A | 6/1998 | Creek et al. | |
| 5,772,671 A | 6/1998 | Harmon | |
| 6,016,949 A | 1/2000 | Slesinger | |
| 6,261,492 B1 | 7/2001 | Lovdalsky | |
| 6,270,472 B1 | 8/2001 | Antaki et al. | |
| 6,273,712 B1 | 8/2001 | Rach et al. | |
| 6,295,272 B1 | 9/2001 | Black et al. | |
| 6,297,737 B1 | 10/2001 | Irvin | |
| 6,850,160 B2 | 2/2005 | Rubinstein | |
| 6,990,866 B2 | 1/2006 | Kibblewhite | |
| 7,098,394 B2 | 8/2006 | Armer et al. | |
| 7,118,767 B2 | 10/2006 | Kim | |
| 7,126,755 B2 | 10/2006 | Moon | |
| 7,174,238 B1 | 2/2007 | Zweig | |
| 7,180,379 B1 | 2/2007 | Hopper et al. | |
| 7,382,258 B2 | 6/2008 | Oldham et al. | |
| 7,412,898 B1 | 8/2008 | Smith et al. | |
| 7,441,462 B2 | 10/2008 | Kibblewhite | |
| 7,663,487 B2 | 2/2010 | Morris et al. | |
| 7,791,481 B2 | 9/2010 | Landt et al. | |
| 7,819,328 B2 | 10/2010 | Levinson | |
| 7,849,807 B2 | 12/2010 | Suzuki et al. | |
| 7,880,617 B2 | 2/2011 | Morris | |
| 8,027,591 B2 | 9/2011 | Maryfield | |
| 8,103,167 B2 | 1/2012 | Tidhar | |
| 8,330,111 B2 | 12/2012 | Ojefors et al. | |
| 8,353,917 B2 | 1/2013 | Mandecki et al. | |
| 8,402,612 B2 | 3/2013 | Wein et al. | |
| 8,608,080 B2 | 12/2013 | Finn | |
| 8,677,139 B1 | 3/2014 | Kalocsai | |
| 8,704,665 B2 | 4/2014 | Yang | |
| 8,711,046 B2 | 4/2014 | Copeland et al. | |
| 8,724,038 B2 | 5/2014 | Ganapathi et al. | |
| 8,785,352 B2 | 7/2014 | Mandecki et al. | |
| 9,418,321 B1 | 8/2016 | Gruda et al. | |
| 9,939,379 B2 | 4/2018 | Kopacka et al. | |
| 10,193,695 B1 | 1/2019 | Endress et al. | |
| 10,554,405 B1 | 2/2020 | Endress et al. | |
| 11,133,866 B2 | 9/2021 | Mandecki et al. | |
| 11,483,072 B1 | 10/2022 | Mandecki et al. | |
| 11,546,129 B2 | 1/2023 | Mandecki et al. | |
| 2001/0044109 A1 | 11/2001 | Mandecki | |
| 2002/0006673 A1 | 1/2002 | Mandecki | |
| 2002/0049411 A1 | 4/2002 | Lamoureux et al. | |
| 2002/0064482 A1 | 5/2002 | Tisone et al. | |
| 2003/0029063 A1* | 2/2003 | Takesada | G09F 3/02 40/299.01 |
| 2003/0062988 A1 | 4/2003 | Mandecki et al. | |
| 2003/0063551 A1 | 4/2003 | Takeuchi | |
| 2004/0029109 A1 | 2/2004 | Derhsing | |
| 2004/0052203 A1 | 3/2004 | Brollier | |
| 2004/0101966 A1 | 5/2004 | Davis et al. | |
| 2004/0179267 A1 | 9/2004 | Moon | |
| 2005/0150740 A1 | 7/2005 | Finkenzeller et al. | |
| 2005/0157304 A1 | 7/2005 | Xiao et al. | |
| 2005/0200421 A1 | 9/2005 | Bae et al. | |
| 2005/0242963 A1 | 11/2005 | Oldham et al. | |
| 2005/0258939 A1 | 11/2005 | Kantrowitz | |
| 2006/0004370 A1 | 1/2006 | Bagby | |
| 2006/0023219 A1 | 2/2006 | Meyer et al. | |
| 2006/0053025 A1 | 3/2006 | Mertens | |
| 2006/0062582 A1 | 3/2006 | Suzuki et al. | |
| 2006/0080819 A1* | 4/2006 | McAllister | G06K 17/00 29/403.3 |
| 2006/0084934 A1 | 4/2006 | Frank | |
| 2006/0256338 A1 | 11/2006 | Gratton et al. | |
| 2006/0292559 A1 | 12/2006 | Reddy et al. | |
| 2007/0021929 A1 | 1/2007 | Lemmo et al. | |
| 2007/0141760 A1 | 6/2007 | Ferguson et al. | |
| 2007/0225055 A1* | 9/2007 | Weisman | A63F 1/14 273/149 P |
| 2007/0269217 A1 | 11/2007 | Yu et al. | |
| 2008/0012577 A1 | 1/2008 | Potyrailo | |
| 2008/0025729 A1 | 1/2008 | Funada | |
| 2008/0030305 A1 | 2/2008 | O'Connor | |
| 2008/0165059 A1* | 7/2008 | Karr | G01S 13/765 342/378 |
| 2008/0174436 A1 | 7/2008 | Landt et al. | |
| 2008/0254400 A1 | 10/2008 | Scherl et al. | |
| 2008/0304527 A1 | 12/2008 | Gao et al. | |
| 2008/0307117 A1 | 12/2008 | Muller-Cohn et al. | |
| 2009/0112179 A1 | 4/2009 | Zoltan et al. | |
| 2009/0225415 A1 | 9/2009 | Hughes et al. | |
| 2009/0243729 A1 | 10/2009 | Gao et al. | |
| 2009/0278662 A1 | 11/2009 | Sanchez et al. | |
| 2010/0142967 A1 | 6/2010 | Perez | |
| 2010/0214062 A1 | 8/2010 | Hayashida | |
| 2010/0218623 A1 | 9/2010 | Eggers et al. | |
| 2010/0322494 A1 | 12/2010 | Fauver et al. | |
| 2011/0013911 A1 | 1/2011 | Alexander et al. | |
| 2011/0201106 A1 | 8/2011 | Sohn et al. | |
| 2012/0041111 A1 | 2/2012 | Christensen et al. | |
| 2012/0069397 A1 | 3/2012 | Bury | |
| 2012/0132718 A1 | 5/2012 | Manzi | |
| 2012/0224868 A1 | 9/2012 | Proesel et al. | |
| 2013/0057348 A1 | 3/2013 | Proesel et al. | |
| 2013/0230167 A1 | 9/2013 | Bauchot et al. | |
| 2013/0255079 A1 | 10/2013 | Maijala et al. | |
| 2013/0330072 A1 | 12/2013 | Xia et al. | |
| 2013/0332018 A1 | 12/2013 | Kim | |
| 2014/0001272 A1 | 1/2014 | Prestros | |
| 2014/0049323 A1 | 2/2014 | Proesel et al. | |
| 2014/0106470 A1 | 4/2014 | Kopacka et al. | |
| 2014/0119746 A1 | 5/2014 | Kalogerakis et al. | |
| 2014/0374571 A1 | 12/2014 | Okamoto et al. | |
| 2015/0086971 A1 | 3/2015 | Botma | |
| 2015/0134552 A1 | 5/2015 | Engels et al. | |
| 2016/0188838 A1 | 6/2016 | Bradley et al. | |
| 2017/0064570 A1 | 3/2017 | Shen et al. | |
| 2018/0085747 A1 | 3/2018 | Mandecki et al. | |
| 2018/0091224 A1 | 3/2018 | Mandecki et al. | |
| 2018/0167148 A1 | 6/2018 | Vannucci et al. | |
| 2018/0211718 A1* | 7/2018 | Heath | G16H 80/00 |
| 2019/0104572 A1 | 4/2019 | Clark et al. | |
| 2019/0138778 A1 | 5/2019 | Lohar | |
| 2019/0195745 A1 | 6/2019 | Hendrickx et al. | |
| 2019/0325280 A1 | 10/2019 | Fan et al. | |
| 2020/0020229 A1 | 1/2020 | Groeneweg | |
| 2020/0202291 A1 | 6/2020 | Yamamoto et al. | |
| 2021/0042481 A1* | 2/2021 | Danaei-Moghaddam | A61C 13/00 |
| 2021/0150298 A1 | 5/2021 | Salimi Jazi | |
| 2021/0282236 A1* | 9/2021 | Clark | G06K 19/07758 |
| 2022/0085992 A1* | 3/2022 | Eibon | H01L 27/14665 |
| 2022/0224503 A1* | 7/2022 | Mandecki | H04L 7/0075 |
| 2022/0224504 A1 | 7/2022 | Mandecki et al. | |

FOREIGN PATENT DOCUMENTS

| | | | |
|---|---|---|---|
| GB | 2138205 A | 10/1984 | |
| JP | H0626256 U | 4/1994 | |
| WO | WO-0237721 A1 | 5/2002 | |
| WO | WO-2005119588 A1 * | 12/2005 | B42D 25/00 |
| WO | WO-2011/137325 | 11/2011 | |

(56) References Cited

FOREIGN PATENT DOCUMENTS

| WO | WO-2017153971 | 9/2017 |
|----|---------------|--------|
| WO | 03/036861 A1  | 5/2023 |

OTHER PUBLICATIONS

U.S. Appl. No. 17/466,725.
U.S. Appl. No. 16/841,492.
U.S. Appl. No. 17/140,633.
Braeckmans, K, DeSmedt, SC, Leblans, M, Pauwels, R, Demeester, J. "Encoding microcarriers: present and future technologies". Nature Reviews Drug Discovery; (1); p. 447-456; (2002).
Collins, Jonathan, Putting Tags on Test Tubes, RFID Journal Live! Europe, asserting a date of Apr. 29, 2004, Dexter House, London, England, Downloaded from :www.ilidiournaLcomiarticiesiview?922. (blow-up of test tube image attached as second page).
Gao, Y., Al-Sarawi, S.F. & Abbott, D. Physical unclonable functions. Nature Electronics 3, 81-91 (2020) https://doi.org/10.1038/s41928-020-0372-5.
International Search Report and Written Opinion for PCT/US21/48865, dated Feb. 1, 2022.
International Search Report and Written Opinion dated Jun. 15, 2011 for Application PCT/US2010/049942.
International Search Report and Written Opinion dated Jul. 26, 2021 for Application No. PCT/US2021/017752.
Mandecki, W, Barbara, A, Coradetti, T, Davidowitz, H, Flint, JA, Huang, Z, Kopacka, WM, Lin, X, Wang, Z, Darzynkiewicz, Z. "Microstransponders, the miniature RFID electronic chips, as platforms for cell growth in cytotoxicity assays" Cytometry Part A; (69A); p. 1097-1105; (2006).
Pharmaseq, Illustration of a microtransponder for DNA-probe assays, Feb. 5, 2001, http://web.archive.org/web/20010205050700/http://pharmaseq.com/il lustration. htm 1.
Physical Unclonable Function: https://en.wikipedia.org/wiki/Physical_unclonable_function Retrieved on Jan. 27, 2022.
U.S. Appl. No. 17/174,979, filed Feb. 12, 2021 (Feb. 12, 2021-Present).
U.S. Appl. No. 17/463,809, filed Sep. 1, 2021 (Sep. 1, 2021-Present).
U.S. Appl. No. 17/463,810, filed Sep. 1, 2021 (Sep. 1, 2021-Present).
U.S. Appl. No. 17/463,812, filed Sep. 1, 2021 (Sep. 1, 2021-Present).
U.S. Appl. No. 16/841,492, filed Apr. 6, 2020 (Apr. 6, 2020-Present).
U.S. Appl. No. 17/140,633, filed Jan. 4, 2021 (Jan. 4, 2021-Present).
U.S. Appl. No. 17/466,725, filed Sep. 3, 2021 (Sep. 3, 2021-Present).
U.S. Appl. No. 14/053,938, filed Oct. 15, 2013 (Oct. 15, 2013-Present).
U.S. Appl. No. 12/889,007, filed Sep. 23, 2010 (Sep. 23, 2010-Present).
U.S. Appl. No. 13/239,801, filed Sep. 22, 2011 (Sep. 22, 2011-Present).
U.S. Appl. No. 13/239,984, filed Sep. 22, 2011 (Sep. 22, 2011-Present).
U.S. Appl. No. 13/870,357, filed Apr. 25, 2013 (Apr. 25, 2013-Present).
U.S. Appl. No. 14/631,321, filed Feb. 25, 2015 (Feb. 25, 2015-Present).
U.S. Appl. No. 15/410,189, filed Jan. 19, 2017 (Jan. 19, 2017-Present).
U.S. Appl. No. 13/239,779, filed Sep. 22, 2011 (Sep. 22, 2011-Present).
U.S. Appl. No. 17/683,047, filed Feb. 28, 2022 (Feb. 28, 2022-Present).
U.S. Appl. No. 17/830,047, filed Feb. 28, 2022 (Jan. 18, 2023 to Present).
U.S. Appl. No. 17/683,047.
Image File Wrapper for U.S. Appl. No. 17/830,047, filed Feb. 28, 2022.
Image File Wrapper for U.S. Appl. No. 17/463,809.
Mandecki W., et al., "All Optical Identification and Sensor System with Power on Discovery," U.S. Appl. No. 14/631,321, filed Feb. 25, 2015, 41 Pages.
Image File Wrapper for U.S. Appl. No. 17/463,810, filed Sep. 1, 2021.
Extended European Search Report for Application No. 21754158.0, dated Feb. 1, 2024.
Image File Wrapper for U.S. Appl. No. 17/463,812.
Image File Wrapper for U.S. Appl. No. 17/463,810.

\* cited by examiner

LIGHT-TRIGGERED TRANSPONDER

CROSS-REFERENCE TO RELATED APPLICATIONS

This case is a Continuation of U.S. patent application Ser. No. 17/174,979 filed Feb. 12, 2021; which claims the priority from U.S. Provisional Application No. 62/976,684 filed Feb. 14, 2020, and U.S. Provisional Application No. 63/010,602 filed Apr. 15, 2020. The above-listed applications are incorporated herein by reference in their entirety entireties.

BACKGROUND

As described in U.S. Pat. No. 7,098,394, very small, light-triggered transponders (MTPs) are available to provide identifiers, for example as identifiers used in conjunction in nucleic acid assays. These have proven to be stable under physiological conditions. Hence, they can be used as implanted tagging devices for animals, as described in more detail in U.S. Pat. No. 8,353,917. MTPs can provide output signals as RF, or as light (U.S. Patent Publication No. 2018/0091224). Such MTPs are available as p-Chip® transponders from PharmaSeq, Inc., Monmouth Junction, NJ.

The optical MTPs are triggered by a narrowly focused light beam which can be pulsed in order to provide a data clock for use by the MTP. Conventional MTPs may be equipped with a photodiode for obtaining the clock pulse from the modulated light beam. When the light is on, photo-generated charges are collected and the photodiode's junction capacitor is charged, resulting in a voltage rise across the capacitor. When the light is turned off, the voltage across the photodiode capacitor drops as the charges are discharged through a parallel-connected resistor. The value of this resistor sets the RC time constant of the rising edge and falling edge of the pulse at the front-end of the clock recovery circuit. If its resistance is too high, the length of time to discharge the flooding charges in the photodiode area during high illumination conditions may cause clock bit missing. If its resistance is too low, the small amount of photo-generated charges during very low illumination conditions may result in difficulty charging the photodiode capacitor. Moreover, these charges are rapidly lost through the resistor, resulting in clock failure. As such there is a need, among other things for an improved optical transponder clock recovery circuit.

SUMMARY

In accordance with some embodiments of the present disclosure, there is provided a light-triggered transponder including an optimized clock recovery circuit to facilitate MTP signal transmission and MTP ID reading enhancement.

In some embodiments, a light-triggered transponder may include a reverse antenna system which may be configured to provide accurate MTP signal transmission and processing and lead to a MTP ID reader with a greater read distance with simpler processing.

In some embodiments, a light-triggered transponder may be included in a security inlay for establishing the bona fides of an item. For example, the security inlay may be used to verify high value items and/or items where food safety, fair trade, and sustainability claims have commercial value (e.g., lettuce, coffee beans, etc.) However, the security inlay is not limited to use with any particular item or class of items. A security inlay may include: (a) a bottom inlay segment; (b) a top inlay segment configured to fit to or dispose on the bottom inlay segment; (c) a light-triggered transponder with a top side and a bottom side disposed between the two inlay segments, with the bottom side glued to the bottom inlay segment and the top side glued to the top inlay segment, wherein the security inlay is configured so that a separation of the top inlay segment from the bottom inlay segment breaks the light-triggered transponder such that the light-triggered transponder cannot be read.

In some embodiments, a light-triggered transponder may be configured with durable self-destructive functions to provide a super anchor for object authentication, object tracing and tracking.

In some embodiments, one or more super anchors may be utilized with various objects to implement a smart paper contract to improve document security.

In some embodiments, one or more super anchors may be integrated with blockchain technology for generating a secure document smart contract.

It is to be understood that the disclosure is not limited in its application to the details of constructions and to the arrangements set forth in the following description or illustrated in the drawings. The disclosure is capable of embodiments in addition to those described and is capable of being practiced and carried out in various ways. Also, it is to be understood that the phraseology and terminology employed herein, as well as in the abstract, are for the purpose of description and should not be regarded as limiting.

It is to be understood that both the foregoing general description and the following detailed description are explanatory only and are not restrictive of the claimed subject matter.

BRIEF DESCRIPTION OF THE DRAWINGS

Various objectives, features, and advantages of the disclosed subject matter can be more fully appreciated with reference to the following detailed description of the disclosed subject matter when considered in connection with the following drawings, in which like reference numerals identify like elements.

DETAILED DESCRIPTION

Figure 1:
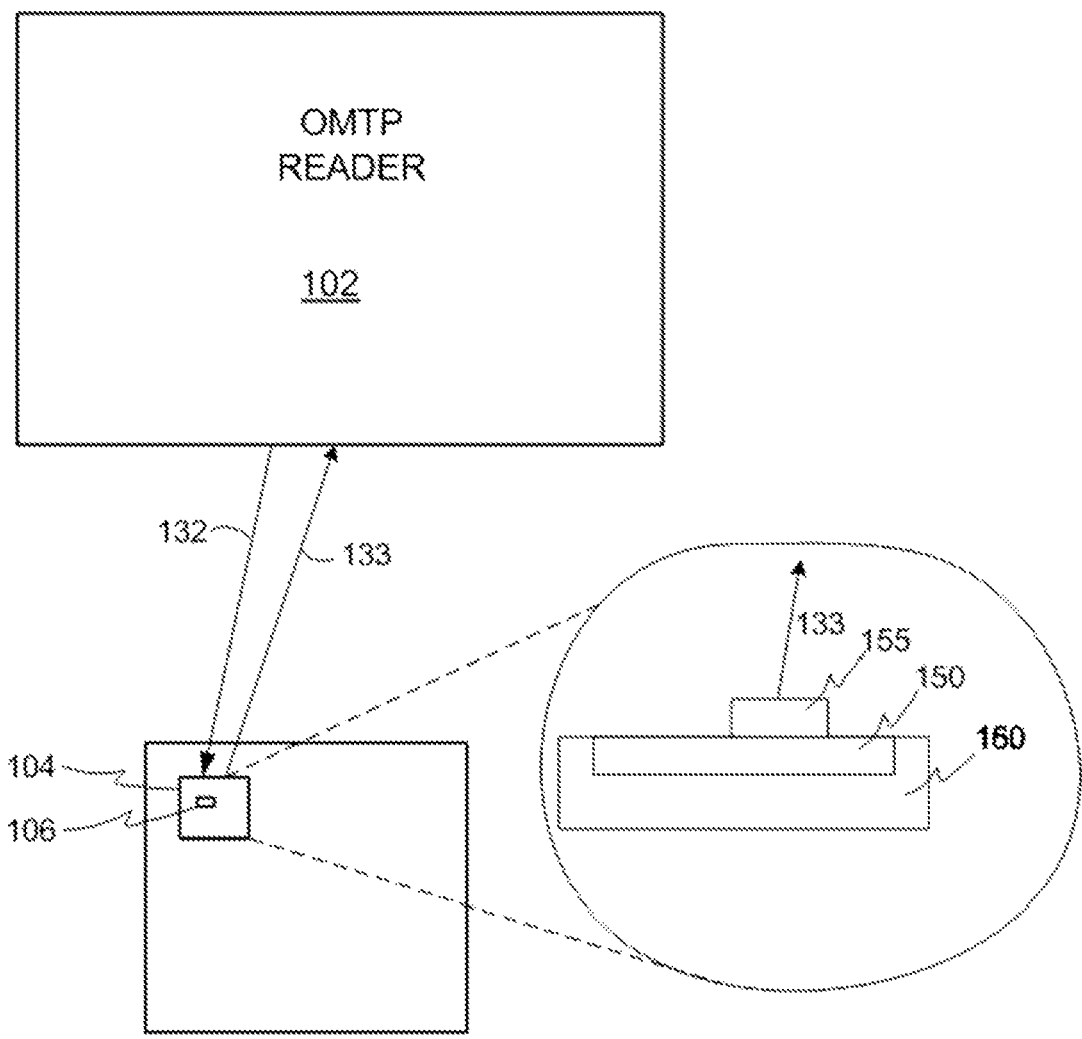
FIG. 1 illustrates a block diagram of operation of the MTP sensor system in accordance with some embodiments of the present disclosure.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways. Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

FIG. 1 depicts a block diagram of an optical microtransponder (MTP) sensor system 100 ("system 100") in accordance with some embodiments of the present disclosure. The system 100 comprises a MTP reader 102 and a MTP 104. In some embodiments, the MTP 104 is bonded or adhered via adhesive to an object so as to operate as an identifier for the object. The MTP 104 may be adhered to, implanted within, or otherwise attached to an object 110 which may be any object requiring individual unique identification (ID) data such as a microscope slide, a test animal or insect, clothing, electronic parts, and the like. An enlargement of the MTP 104 is depicted in the breakout shown in FIG. 1 to illustrate OTMP components of a substrate 160, photo elements 150, and an optical communication circuit 155. The height of the MTP 104 can be for example approximately 20 μm-60 μm and dependent on the number of stacked layers and sensors for a particular MTP 104. The MTP 104 may be an integrated circuit which may be normally in a persistent dormant unpowered state until powered on when illuminated with an excitation beam 132 from the MTP reader 102. Upon illumination, the MTP 104 may power on (generally instantly, e.g., much less than 1 second) and transmit a data beam 133 via light or Rf to the MTP reader 102. The data beam 133 in some embodiments may be an emission (e.g., from a light emitting diode (LED)) or in other embodiments, a reflection/absorption mechanism (e.g., shuttering via LCD). In alternative embodiments, the MTP 104 receives a separate stimulus such as a code modulated onto the excitation beam 132 which initiates transmission of the sensor data. Alternatively, receiving data from an internal or linked sensor triggers a transmission of the data beam 133. Some embodiments of system 100 may include an onboard power supply such as a battery and/or one or more subsystems powered by the onboard power supply. Such subsystems may include, but are not limited to, volatile memory that may be persisted by battery power, one or more sensors in addition to the photo elements 150, and/or other features.

In some embodiments, the excitation beam 132 is a visible focused light or laser beam and the data beam 133 is an infrared light beam emission (e.g., from an infrared emitting diode). The data beam 133 may contain a signal to identify the specific MTP 104 to the MTP reader 102, for example using an identification number unique to the specific MTP 104. Using the unique identification information, the MTP reader 102 may transmit data to a computer (not shown) to uniquely identify the object 110. In some embodiments, a user operates the MTP reader 102 to illuminate the MTP 104 with a light or other electromagnetic signal that causes the MTP 104 to transmit the data beam 133 via light or other electromagnetic signal. For example in some embodiments the range of electromagnetic spectrum used by MTP 104 for this signaling may include one or more subsets of the sub-terahertz portion of the spectrum, including infrared and longer wavelengths. The data beam 133 is then received by the MTP reader 102. The MTP reader 102 then may decode the data beam 133 carrying identification data to unambiguously identify the object 110.

"Laser" shall be defined herein as coherent directional light which can be visible light. A light source includes light from a light emitting diode (LED), solid state lasers, semiconductor lasers, and the like, for communications. The excitation beam 132 in some embodiments may comprise visible laser light (e.g., 660 nm wavelength). In some embodiments, the excitation beam 132 in operation may illuminate a larger area than that occupied by the MTP 104, thereby allowing a user to easily localize and read the MTP 104. In some embodiments, the excitation beam 132 may comprise other wavelengths of light in the visible and/or invisible spectrum necessary to supply sufficient power generation using photocells of the MTP 104. The data beam 133 may be emitted with a different wavelength than the excitation beam 132. For example, the data beam 133 may be 1300 nm IR light while the excitation beam is 660 nm red light. However, other wavelengths, such as the near-infrared (NIR) band, may be used for optical communication and alternative embodiments may use other communication techniques such as reflective signaling methods to return a modulated data signal to the MTP reader 102. In some alternative embodiments, the OTMP 104 is a microtransponder (MTP) that comprises an antenna (e.g., an integrated antenna) for communicating ID information to a corresponding reader via radio waves rather than a light-based signal.

The clock recovery circuit 106 may extract a clock pulse signal from the received modulated light beam as described in detail further below with respect to FIGS. 6-8. In one embodiment, the light of the excitation beam 132 is amplitude modulated (e.g., pulsed) at approximately 1 MHz to provide the data clock which may be used by the MTP 104 for supplying the operation clock pulses, for example, of transmitted ID data bits. The timing of the pulse groups can be set so that the duty cycles and average power levels fall within requirements for registration as a Class 3R laser device.

Figure 2:
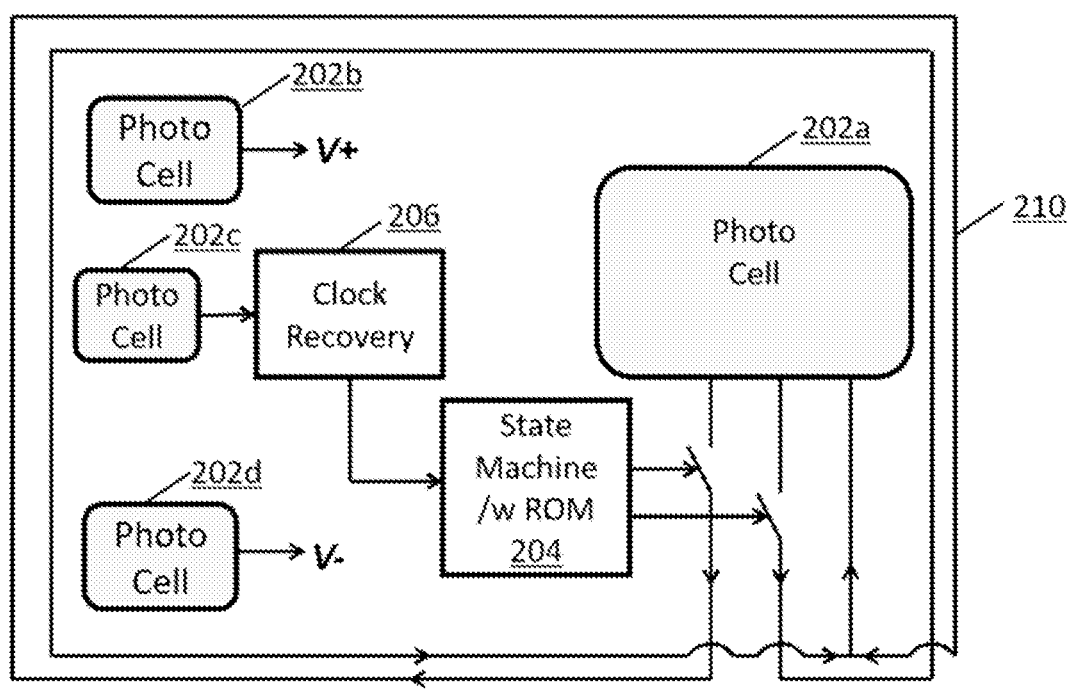
FIG. 2 illustrates a schematic diagram of an exemplary MTP in accordance with some embodiments of the present disclosure.

An example MTP, such as the p-Chip, can be a monolithic (single element) integrated circuit (e.g., 600 μm×600 μm×100 μm) that can transmit its identification code through radio frequency (RF). FIG. 2 illustrates a schematic diagram of an example MTP in accordance with some embodiments of the present disclosure. A MTP may include photocells (202a, 202b, 202c, 202d), clock recovery circuit 206 (e.g., clock signal extraction circuits), a logical state machine 204, a loop antenna 210, and, for example, 64-bit memory (not shown) such as supporting over 1.1 billion possible ID codes. The photocells, when illuminated by a pulsed laser, may provide power to the electronic circuits on the chip with ~10% efficiency. The chip may transmit its ID through modulated current in the antenna 210. The varying magnetic field around the chip may be received by a nearby coil in the reader, and the signal may be digitized, analyzed, and decoded. P-Chips may be manufactured on silicon wafers in foundries, using CMOS processes similar to those used in the manufacturing of memory chips and computer processors. Wafers may receive post-manufacturing treatment including laser encoding, passivation, thinning, and dicing to yield individual p-Chips. The p-Chip surface may be made of silicon dioxide, which is deposited as a final passivation layer.

Figure 3:
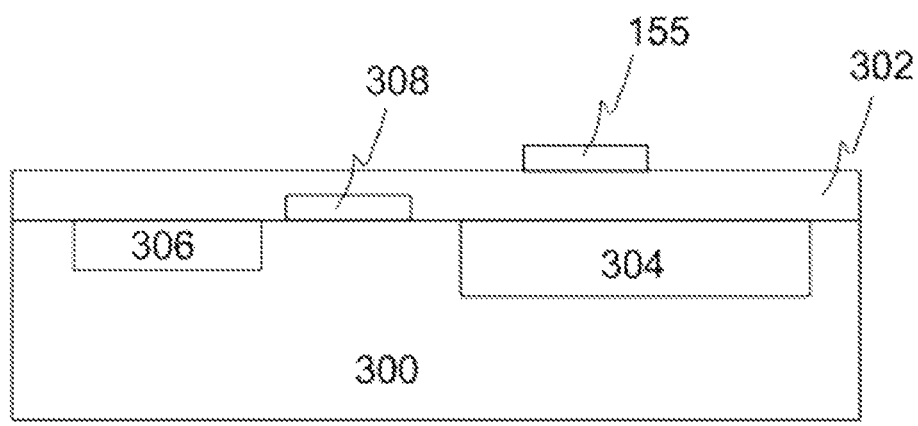
FIG. 3 illustrates a side view representation of an exemplary MTP in accordance with some embodiments of the present disclosure.

FIG. 3 illustrates a side view representation of an illustrative MTP 104 in accordance with at least one embodiment of the invention. The MTP 104 may comprise a stack of individual integrated circuit layers 300, 302, 304, 306, and 308. The layer 302 may support a protection and passivation layer. The layer 304 may comprise logic, clock, sensors, and transmitter circuits. Layers 306 and 308 may comprise storage capacitors; and 300 is the substrate. Those of skill in the art will recognize that functions of the MTP 104 can be organized into layers of other configurations. For example, the stacking may comprise layers of differing thicknesses uniformly overlaid so that they can be manufactured for example in a 3D IC process well-known in the art.

The MTP 104 may be manufactured using mixed-signal manufacturing technology that is typically used to make sensor electronics or analog-to-digital converters which comprise both analog and digital devices together. In an example embodiment, each layer is approximately 12 μm thick and 100 μm×100 μm in dimension. In one embodiment, dimensions of the MTP 104 are 100×100×50 μm. Alternative embodiments may use more or less layers, for instance as depending on the sensor application.

Figure 4:
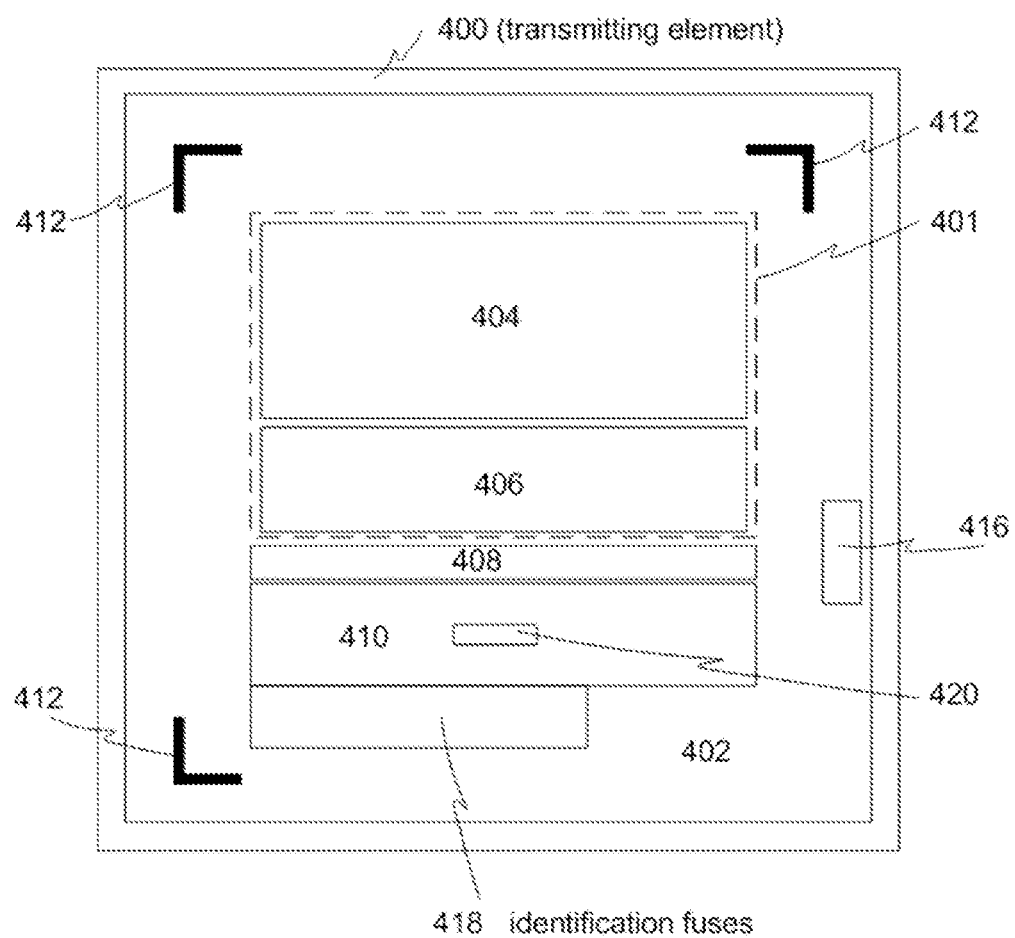
FIG. 4 is a top plan view representation of an exemplary MTP in accordance with some embodiments of the present disclosure.

FIG. 4 illustrates a top plan view representation of an illustrative MTP 104. The view depicted in FIG. 4 is of the top layer 302 of FIG. 3. In one embodiment, on top of the layer 302 comprises a transmitting element, such as an LED array 400, that circumscribes the periphery of the MTP 104. In other embodiments, an LED array may be realized as a single LED in the middle of 410 (shown in phantom as LED 420) or other topography for directed light emission. The placement of the LED array 400 depicts an example of an embodiment emphasizing light generation. Alternative embodiments may include varying topography layouts favoring power harvesting or capturing sensor data and the like. In some embodiments, the LEDs may include focusing lenses or other optics.

Centrally located on the top layer 302 is an array 401 of photocells 402, 404, 406, and photoconductor 408. As illustrated, each photocell in array 401 can be physically sized to create power for a particular circuit within the MTP 104 and one can be dedicated to clock/carrier signal extraction as described below with respect to FIG. 4. Photocell 402, the largest in area, produces a voltage Vdd (in some embodiments, a negative voltage, Vneg) for operating the output transistor 416 to drive the electronic radiation transmitter (realized in some embodiments as an LED in the optical communication circuit 155). Photocell 404 produces a positive voltage for logic/sensor circuits 410, and photocell 406 produces a negative voltage, Vneg, for logic/sensor circuits block 410. Photoconductor 408 is used to extract clock pulses, e.g., for operating the logic/sensor circuits 410. As illustrated, the power cells are coupled to capacitors, for example, in layers 306 or 308 for storing the energy produced by the photocells when illuminated by laser light. In some embodiments, energy extracted from the clock photoconductor 408 is applied to a differentiator (described below with respect to FIG. 6) which extracts clock edges which are amplified and used to provide timing signals to the logical and sensing circuits. As illustrated, a plurality of identification fuses 418 is located on the surface 414. By opening select ones of these fuses, the MTP 104 is provided a unique identification code range beyond a default base page of code values that may be hard-coded into the chip logic. In an alternative embodiment, the ID values may be electronically coded using electronic antifuse technology. Further still are embodiments with electronic memory for data, signal processing, and identification storage.

Figure 5:
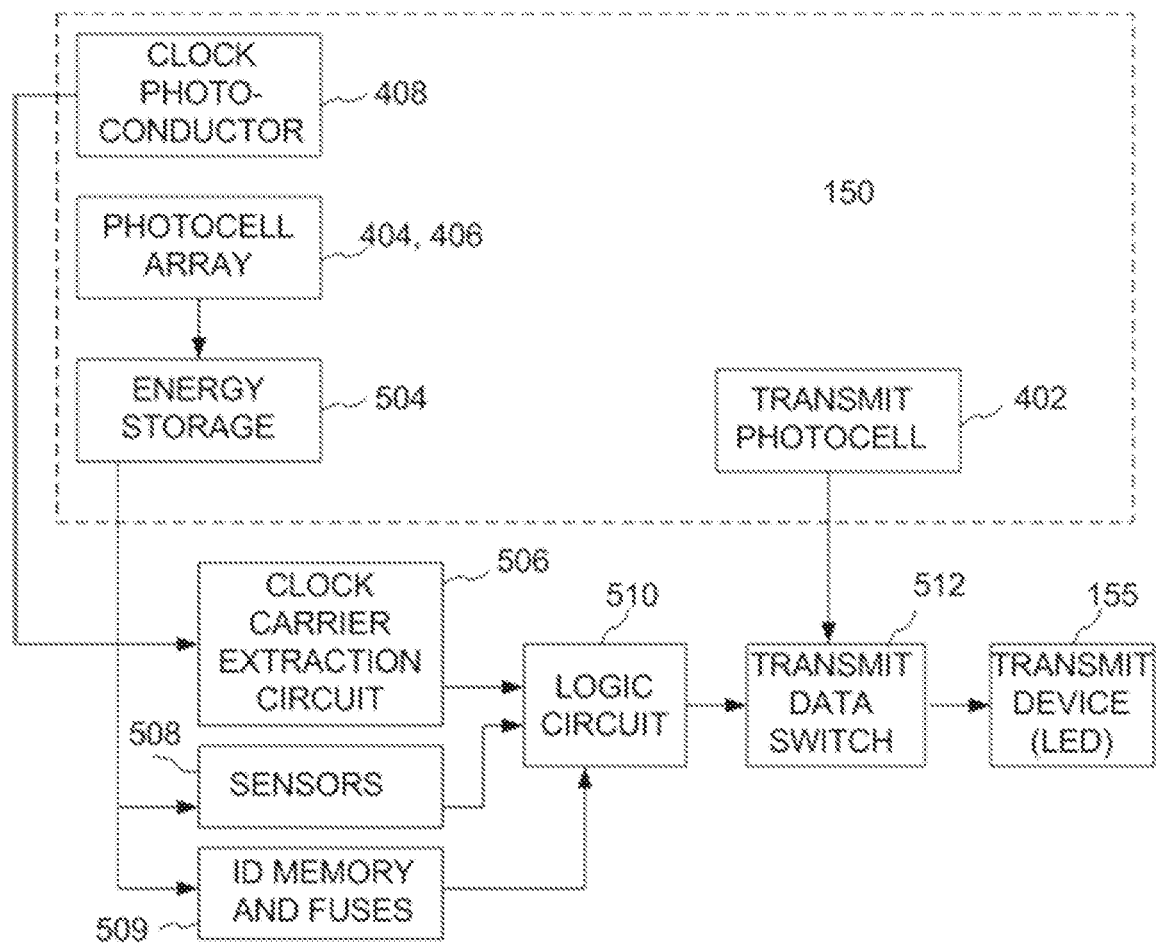
FIG. 5 illustrates a functional block diagram of an exemplary MTP in accordance with some embodiments of the present disclosure.

FIG. 5 depicts a functional block diagram of an illustrative MTP 104 in accordance with at least one embodiment of the invention. The MTP 104 may comprise the photo elements 150, energy storage 504, clock/carrier extraction network 506 (i.e., clock recovery circuit 106), sensors 508, logic 510, transmit switching circuit 512, and a transmitting device 155 such as an IR LED. The photo elements 150 can include dedicated photocells such as the clock extraction photoconductor 408, the energy harvesting photocell array 404, 406, and the transmit photocell 402. The energy harvesting photocell array 404 and 406 may be coupled to energy storage 504 and may comprise photovoltaic cells which convert light energy from illumination into an electrical current.

The clock photoconductor 408, which is part of the clock recovery circuit and can be physically located in different places from the recovery circuits, may detect a clock pulse signal for the clock/carrier extraction circuit 506. In some embodiments, the energy storage 504 is a plurality of capacitors having at least one capacitor coupled to a photocell of the photocell array 404, 406. The energy stored in the energy storage unit 504 may be coupled to the electronic circuits. Since the laser light is pulsed, the energy from the laser may be accumulated and the MTP 104 may operate on the stored energy. Unlike the photocell array 404 and 406, in some embodiments the energy of photocell 402 is not stored and the transmitter switching circuit 512 via output transistor 416 can "dump" all of its energy into the transmit element 155. As the received laser pulse energy is extracted by the clock/carrier extraction circuit 506, the logical state machine (i.e., logic 510) may form data packets comprising the ID bits and sensor data and provide these to the transmit data switch 512 for the formation of the optical transmission signal. The logic 510 may directly integrate the sensor and ID signal(s) into a composite data frame of the OOK (on-off keyed) emitter. The modulation symbols may be applied to the transmitter 512 and transmitted with each pulse of energy.

The sensor(s) 508, if present, can comprise one or more sensors, for, for example, measuring biological cell or physiological characteristics. Any analog data from the sensor(s) 508 may be converted into a pulse width modulated signal or other binary signaling method that encodes the analog quantity in the time domain in a manner suitable for pulsing the IR emitting diode for direct transmission to the MTP reader 102 without the need for traditional, power and area intensive analog to digital conversion techniques. Example sensors include, but are not limited to, a dielectric sensor, a proportional to absolute temperature (PTAT) sensor, a pH sensor, a redox potential sensor, and/or light sensor.

Clock Recovery Circuit

Figure 6:
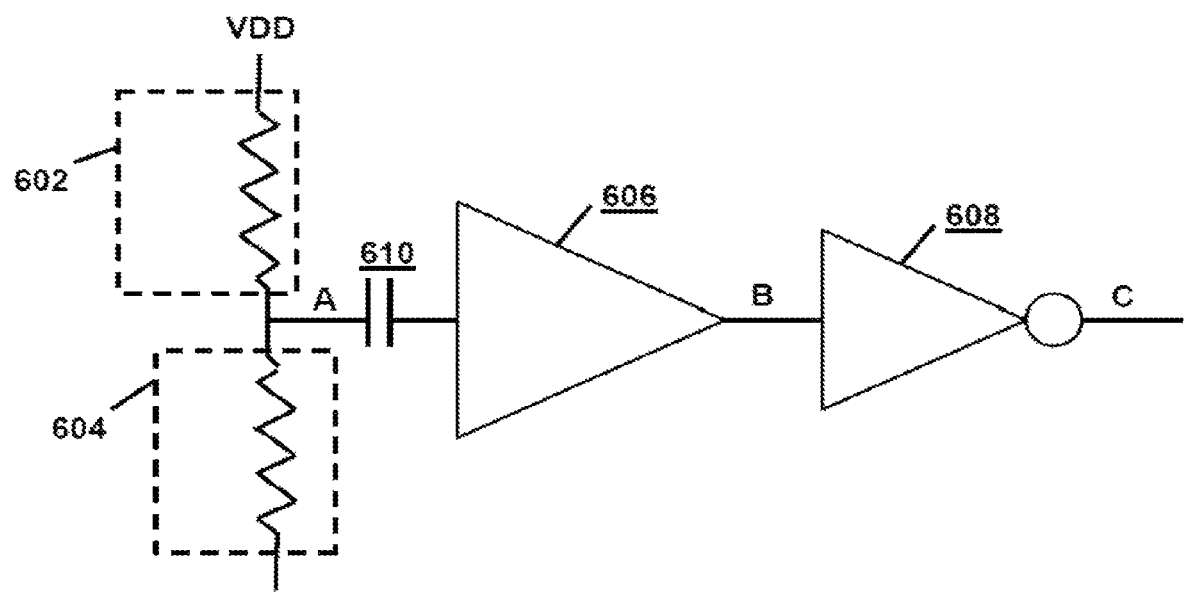
FIG. 6 illustrates a schematic diagram of a clock recovery circuit in accordance with some embodiments of the present disclosure.

FIG. 6 is a schematic diagram of a clock recovery circuit 506 in accordance with one or more embodiments of the present invention. The clock recovery circuit 506 may comprise a photoconductor 602 (shown in detail in FIG. 6) having a resistance R1 that varies as a function of received light intensity, a reference resistor 604 having a fixed resistance R2, an amplifier 606 and an inverter 608. A source terminal of the photoconductor 602 is coupled to a first terminal of the resistor 604 at a node A. Node A is coupled to the input of the amplifier 606, and the output of the amplifier 606 is coupled to the inverter 608 which generates the recovered clock circuit at its output.

The series combination of the photoconductor 602 and the resistor 604 form a voltage divider R that is coupled between a voltage VDD and ground. Specifically, in this embodiment, a drain terminal of the photoconductor 602 is coupled to the voltage VDD from the energy storage 504, which sustains the voltage when the illumination is off, and the second terminal of the resistor 604 is coupled to ground. Since the resistance R1 of the photoconductor 602 varies as a function of received light intensity, and the voltage at node A is determined by the ratio of the resistances R1 and R2, a modulated light input incident on the photoconductor 602 produces a modulated voltage signal at the input of the amplifier 606.

In some embodiments, a coupling capacitor 610 is added in front of the amplifier 606. The voltage divider R and the coupling capacitor 610 form a differentiator which may extract clock edges when the modulating frequency is as low as a few kilohertz (at approximately 1 MHz or above, this may not be necessary). The inverter 608 digitizes the analog output of the amplifier 606, resulting in an example digital waveform as shown in FIG. 8. FIG. 8 illustrates a timing diagram of the light intensity and the voltage signal at each node of the clock recovery circuit 506 with a coupling capacitor of FIG. 6.

Figure 7:
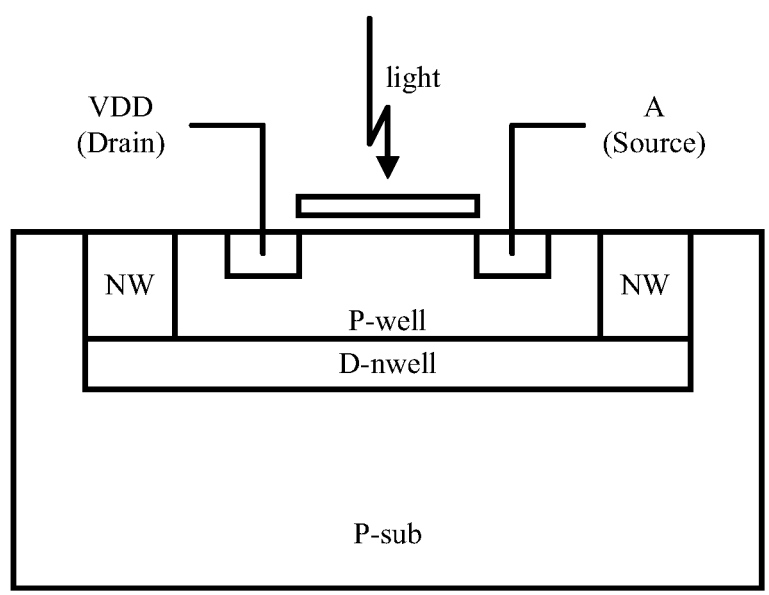
FIG. 7 illustrates a cross-section view of the photoconductor in accordance with some embodiments of the present disclosure.
Figure 8:
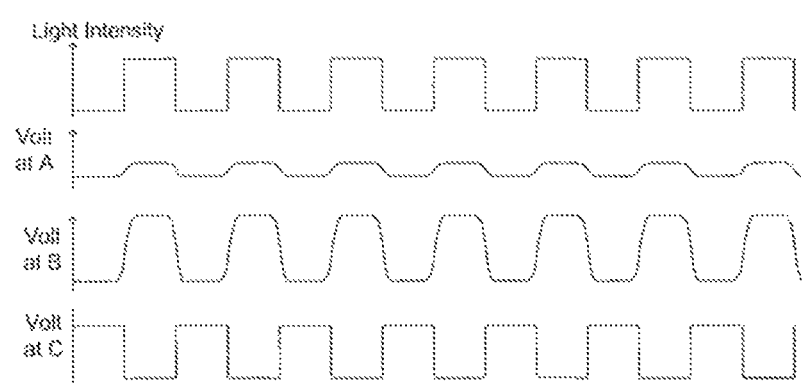
FIG. 8 illustrates a timing diagram of the voltage signal at each node of the FIG. 6 as well as the light intensity in accordance with some embodiments of the present disclosure.

FIG. 7 illustrates a cross-section view of an example photoconductor 602 in accordance with some embodiments of the present invention. In some embodiments, the size of the photoconductor 602 can be 5 um×5 um or larger. As illustrated in FIG. 6, the photoconductor 602 may employ a long channel n-MOSFET in an isolated deep n-well bucket. The n-wells and the deep n-well (D-nwell) may completely seal the p-well, in the p-substrate, and the transistor components, i.e., the source, drain, and gate which are confined in the bucket. The gate layer, for example made from polysilicon material, may be disposed on top of an insulating layer, such as silicon dioxide ($SiO2$). The polysilicon material spectrum-wise absorbs shorter wavelength light, such as blue light, but passes longer wavelength light, such as red light. When using an excitation beam 132 having a longer wavelength, such as a red light beam, the polysilicon material filters and blocks the shorter wavelengths and passes the long wavelength. As such, it suppresses shorter wavelengths. For example, a room light (e.g., a fluorescent lamp) that flickers at the speed of 60 Hz may produce some interference or noise having more spectrum in the shorter wavelength (blue wavelength) range, and the polysilicon material effectively blocks the flickering from the room light and only passes the desired energy beam (e.g., the red light).

Further, the photoconductor 602 (which may also be referred to as a photoresistor) allows the clock recovery circuit 106 to function under both low illumination and high illumination conditions in contrast to photodiode-based clock recovery circuits. For example, under sufficiently high illumination, excessive flooding charges in a photodiode cannot be sufficiently discharged, resulting in the malfunction of a photodiode-based clock recovery circuit. In contrast, the photoconductor 602 can be operated in current mode and may be less affected by the high illumination flooding phenomenon since photo charges are drained constantly by the electric field in the photoconductor 602. Additionally, the deep n-well bucket of the photoconductor 602 is isolated such that the n-wells physically form a potential barrier that prevents charges generated outside of this bucket from entering the bucket, ensuring that only those photons arriving inside the bucket can contribute to the conductivity of the photoresistor 602. As such, excessive photogenerated charges during high illumination, which may result in malfunctioning of photodiode-based clock recovery circuits, is suppressed in the clock recovery circuit 106.

Additionally, this FET device may have a very small physical footprint. The inverter 608 can comprise a static CMOS inverter device comprising an NMOS and a PMOS transistor and having two states, either high or low. If the inverter input is above a reference voltage, it is considered to be high, below the reference voltage is considered to be low, and then the output is inverted. The static CMOS inverter can also act as an analog amplifier as it has a sufficiently high gain in its narrow transition region to amplify the signal, enabling the clock recovery circuit 506 to have a very small footprint. In instances where the extracted clock pulse is extremely low, amplification by the amplifier 606 may not be sufficient to reach the threshold voltage for flipping the logic state; in these instances, the inverter 608 can further boost the overall amplification to reach its threshold.

The clock recovery system can be applied to MTPs that signal out with RF and those that signal out with light (e.g., via an LED), such as described in U.S. Ser. No. 14/631,321, filed Feb. 25, 2015.

Reverse Antenna System

Each p-Chip may have a unique serial number or identifier (ID) programmed. P-chips may be read by a MTP reader (e.g., a wand) with no duplicate IDs. A MTP reader may be a hand-held device connected to a standard Windows PC, laptop or tablet used to read the MTP and is capable of reading the serial number or ID of individual p-Chips.

Figure 9:
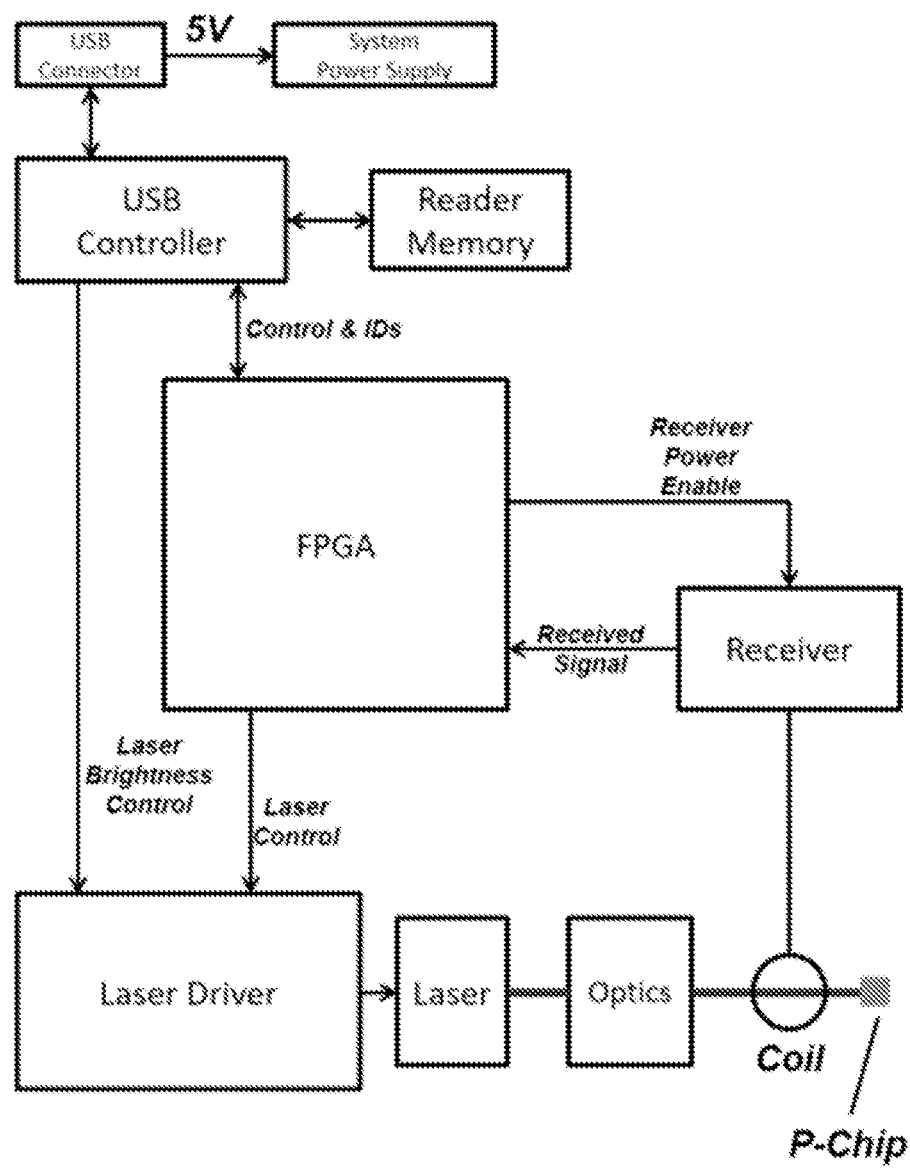
FIG. 9 illustrates a functional block diagram of a MTP reader in accordance with some embodiments of the present disclosure.

FIG. 9 illustrates a functional block diagram of a MTP reader in accordance with some embodiments of the present disclosure. As illustrated in FIG. 9, an example MTP ID reader may be USB-powered and may include a USB 2.0 transceiver microcontroller, a field programmable gate array (FPGA), power converters and regulators, a laser diode with the programmable current driver, an optical collimation/focusing module, and a tuned air coil pickup with a high-gain, low-noise differential RF receiver. The laser emits for example an average of 60 mW of optical power modulated at 1 MHz at 658 nm wavelength when reading a p-Chip identifier (ID). The ID is read when the p-Chip is placed within suitable proximity (e.g., <10 mm) from the reader. The p-Chip generated waveform is compared to the data clock (Laser Modulation) used for the synchronization of the transmitted ID data bits. The resulting ID readout from the p-Chip is rapid (<0.01 s) and is reported on the PC or tablet. The MTP ID reader may be able to read p-Chips under challenging conditions, such as through a sheet of white paper, blue-colored glass (~1 mm thick), or a sheet of transparent plastic laminate. Other MTP readers have been developed (e.g., an instrument for reading IDs with the p-Chip in a fluid). Another version can be a battery operated blue tooth reader that can be used with a PC or cell phone.

Some embodiments may provide efficient means of increasing the signal strength emitted by these small MTPs. The p-Chip data may be transmitted using a data coding that results in one third to two thirds of the transmitted bits having a value of one. The average for all IDs may be half of the data having a value of one. A "1" digital signal is transmitted for example with the laser on and a "0" digital signal is transmitted with the laser off (The photo cell stored energy provides a small amount of energy to be transmitted). The signal power tracks the ratio of ones to zeros in the data. Some embodiments may transmit a "1" digital signal the same as it currently is transmitted, but a "0" digital signal is transmitted with the laser ON with the current flowing in the opposite direction of the current for a "1" digital signal. This results in all IDs being transmitted with the same power. Data may be transmitted when the laser is on. This may result in twice the power in the transmitted signal (6 dB more signal in the receiver, on average). The method may result in easier signal processing and easier differentiation of ones and zeros. This can lead to a MTP ID reader with a greater read distance and simpler processing.

For example, the p-Chip® MTP may be queried with a light flashing at 1 Mhz with a 50% duty cycle. This may be accomplished with a laser or a focused LED, or the like.

Figure 10A:
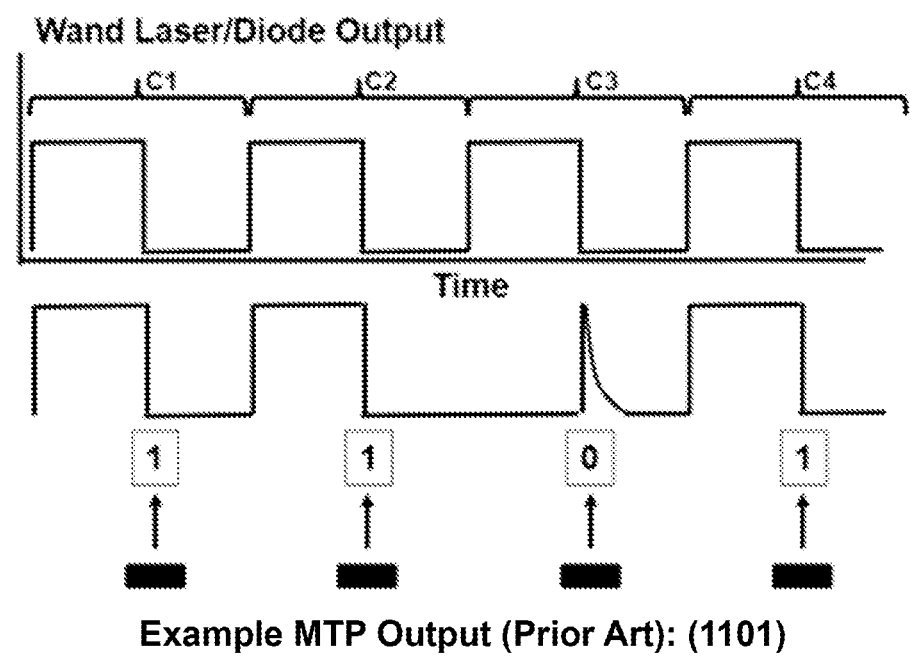
FIG. 10A illustrates in simplified form how a string is transmitted under a prior art system.
Figure 10B:
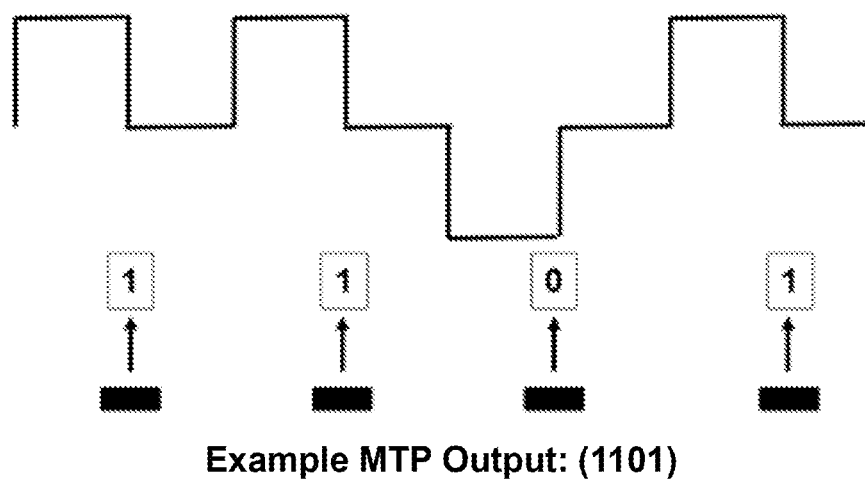
FIG. 10B illustrates in simplified form how a string is transmitted under a reverse antenna system in accordance with some embodiments of the present disclosure.

FIG. 10A illustrates in simplified form how a string of "1101" is transmitted under an old system, and FIG. 10B illustrates in simplified form how a string of "1101" is transmitted under a reverse antenna system described herein, respectively. For each off/on cycle, such as c1, c2, c3 or c4 of FIGS. 10A-10B, the MTP ID reader seeks a radio signal identifying a "1" digital signal or "0" digital signal transmission. As shown in simplified form, for the first illustrative MTP output of FIG. 10A illustrating a prior art system, zeros are transmitted when the light source is off. However, the photo cell capacitance used to transmit the zero is limited. In fact, this limited signal denotes a "0." The limited energy applicable to zero means that signal-to-noise at the MTP reader is restrained by the SNR for the zero. This means that while in principle the "1"s can be read at a significantly greater distance, MTP signal may only be read at the shorter distance applicable to the "0" components of the signal. A method is provided herein that includes reversing the direction of the current in the RF output antenna to transmit a "0" digital signal so as to use substantially the same current for the "1" digital signal and the "0" digital signal (see FIG. 10B). In some embodiments different from FIG. 10B, any given bit ("1" or "0") or digital signal in the p-Chip® MTP may be transmitted within 8 consecutive light cycles.

Figure 11A:
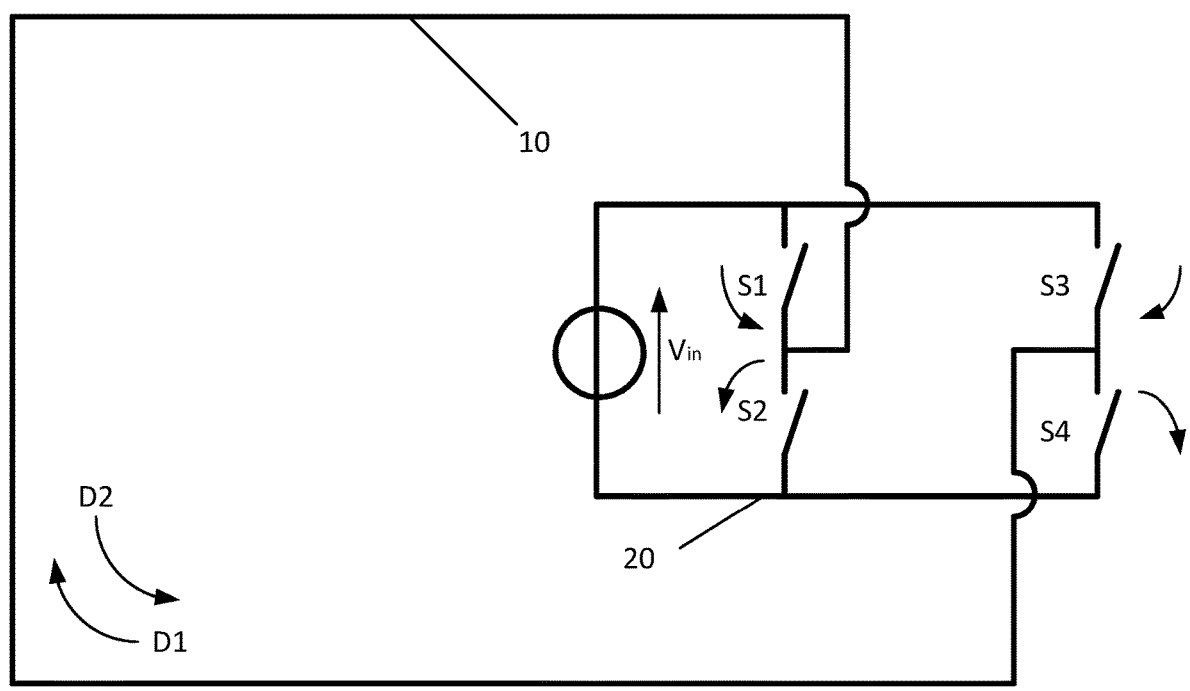
FIG. 11A shows one exemplary diagram of reversing the direction of antenna operation in accordance with some embodiments of the present disclosure.

One means of reversing the antenna current is to use a switching circuit such as an H-bridge. FIG. 11A shows one example diagram of reversing the direction of antenna operation in accordance with some embodiments of the present disclosure. As shown in FIG. 11A, an antenna 10 may be operated by a voltage source $V_{in}$ and an H-bridge 20. Selectively closing switches S1 and S4 may direct a current through the antenna 10 in the direction indicated by the arrows. Selectively closing switches S2 and S3 may direct a current through the antenna 10 in an opposite direction.

Figure 11B:
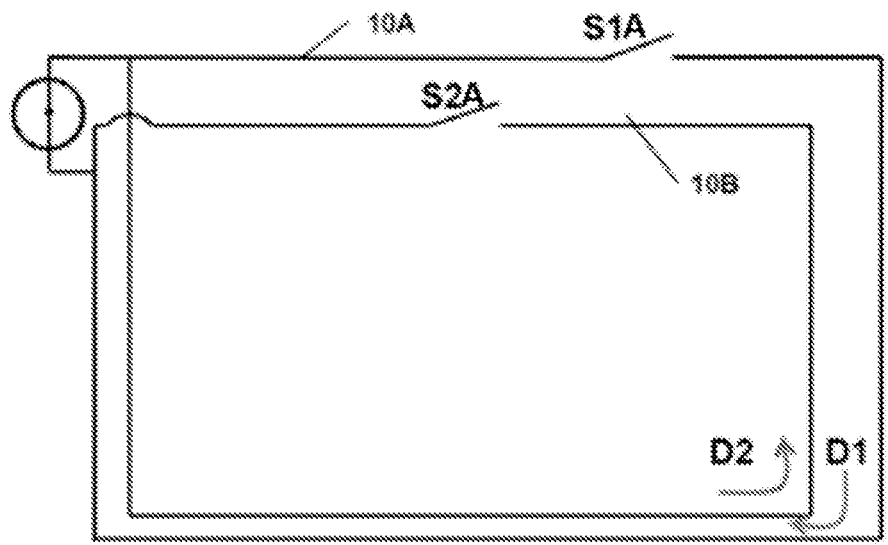
FIG. 11B shows another exemplary diagram of reversing the direction of antenna operation in accordance with some embodiments of the present disclosure.

FIG. 11B shows another example diagram of reversing the direction of antenna operation in accordance with some embodiments of the present disclosure. Another means of reversing the antenna current is to use two switches, such as S1A and S2A in FIG. 11B, and two antennas (e.g. 10A, 10B). Selectively closing switch S1A may direct a current through the antenna 10A in one direction indicated by the arrow. Selectively closing switch S2A may direct a current through the antenna 10B in an opposite direction. If S1 is selectively closed, current moves in direction D1. If S2A is selectively closed, current moves in direction D2, opposite the direction D1. The antenna may be formed in separate metal layers, or on the same layer. Only one FET (S1A or S2A) may be closed at any given time. When either FET is turned on a reverse current may be coupled into the other antenna. The body diode of the off FET may provide a current path for the coupled signal.

In some embodiments, the antenna options described herein may be effected in a monolithic integrated circuit. In some embodiments, the monolithic integrated circuit may be sized about 2 mm×2 mm×0.2 mm or less in thickness.

In some embodiments, the signal strength for a MTP incorporating the above-described bi-phase transmission is increased by about 6 dB. This will increase the reliable read distance of a MTP reader. In some embodiments, the number of cycles committed to transmitting a one bit is 8 data periods. Each laser cycle is one data period. Every time the number of data periods is doubled there is a signal processing gain of 3 dB. Eight data periods is 3 doublings (2, 4, 8). This results in a signal processing gain of 9 dB. By being increased from 8 to 64 (2, 4, 8, 16, 32, 64) or 128 (2, 4, 8, 16, 32, 64, 128) the signal processing gain may increase from 9 dB to 18 dB (for 64 repeats) or 21 dB (for 128 repeats). The current p-Chip using a repeat of 8 times for its 64 data cells when using a laser at 1 MHz may transmit IDs at a rate of 2,000 per second. By increasing the repeat rate to 128 the read rate may decrease to 128 reads per second with a signal gain of 21 dB. This can result in an increased read distance. The laser rate may be increased or decreased (e.g., in a range of 500 KHz to 5 MHz). The repeat rate may be controlled by selecting one of 8 repeat rates (3 addition memory bits).

Security Inlay

MTPs may also be used to implement security features. These can be MTPs that signal out with RF, or those that signal out with light.

Such security features are enhanced where a MTP cannot be removed from its secured object without its MTP function being destroyed. Example objects that may need such security features are bottles of high-end wine. Wine is used herein as an example object to facilitate illustration and explanation of the security inlay structure and function, but, as noted above, the security inlay is not limited to use with wine bottles. Provided herewith is an inlay containing a MTP that may be designed to break the MTP when a tape or foil seal is disrupted.

In some embodiments, a light-triggered transponder may be utilized in a security inlay for security purposes. For example, a security inlay may provide a reliable method to authenticate wine. In the wine industry, the cork or stopper may be sealed with a capsule or foil designed to not allow the stopper to be removed without peeling the capsule. This provides a certain measure of security. However, for high end wines it can be worthwhile to the unscrupulous to acquire the equipment to replicate a capsule. There can be additional wax seals, but these have the same defect as the monetary value of counterfeiting rises.

An example security inlay may include: (a) a bottom inlay segment; (b) a top inlay segment configured to fit and disposed to the bottom inlay segment; (c) a light-triggered transponder with a top and a bottom side disposed between the two inlay segments, with the bottom side glued to the bottom inlay segment and the top side glued to the top inlay segment. The security inlay is configured so that a separation of the top inlay segment from the bottom inlay segment breaks the light-triggered transponder such that it cannot be read.

Figure 12:
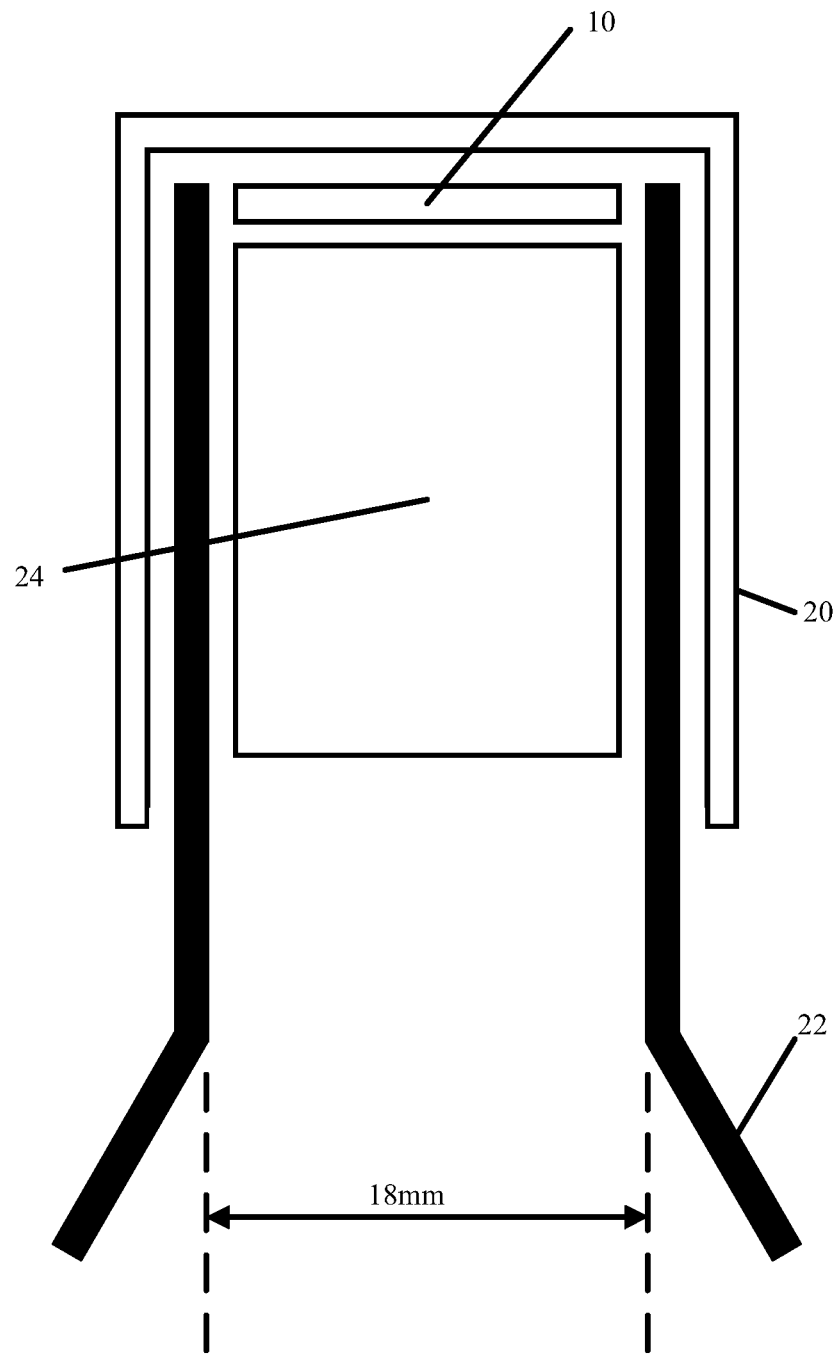
FIG. 12 illustrates the security inlay as fitted to a wine bottle in accordance with some embodiments of the present disclosure.
Figure 13:
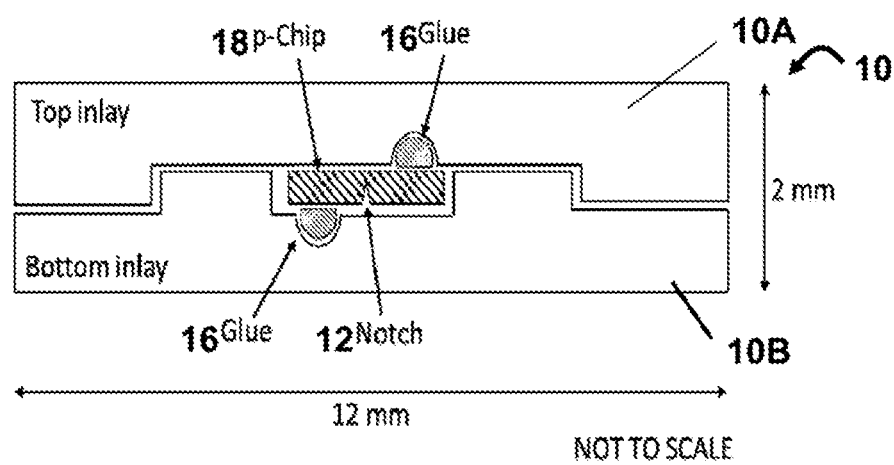
FIG. 13 is a cross-section view of an example security inlay in accordance with some embodiments of the present disclosure.

FIG. 12 illustrates the security inlay as fitted to a wine bottle. As illustrated in FIG. 12, the inlay 10 is shown under the capsule 20 of a wine bottle 22. FIG. 13 is a cross-section view of an example security inlay design in accordance with some embodiments of the present disclosure. As illustrative in FIG. 13, the inlay 10 is composed of two parts, top 10A and bottom 10B, with a MTP 18 mounted in between. The parts can be made of transparent or partially transparent plastic by one of several technologies, such as 3D printing, molding or pressing heated-up plastic. In some embodiments, a specially prepared MTP 18, easy to mechanically break, is used. For example, the MTP's structural integrity may be reduced by a notch 12 on the back of the MTP or by making the MTP very thin (e.g., about 10-about 30 microns). The MTP may be glued to the inlay so as to assure breakage. The adhesion spots can be nonsymmetrical, similar to as illustrated, to assure uneven forces when the top inlay portion is separated from the bottom inlay portion. As shown in FIG. 13, one half of is the MTP may be glued (glue 16) to the inlay bottom 10B, and the other half to the inlay top 10A. Grooves can be made in both inlay top and bottom to accommodate glue. In one embodiment, as illustrated in FIG. 13, the bottom inlay segment has a bottom groove to accommodate glue to adhere to the bottom side of the light-triggered transponder. The top inlay segment has a top groove to accommodate glue to adhere to the top side of the light-triggered transponder.

The two inlay halves may be maintained in place by weaker elements, such as mechanical fit (including slight notches and corresponding bulges) or droplets of weak glue appropriately placed, such as to the perimeter of the inlay (between the halves). The inlay design assures that when the two inlay halves are pulled apart (when the capsule is removed from the bottle), the MTP breaks and no longer functions electrically. Should a would-be counterfeiter cut the capsule around the inlay, the glue 26 may be selected to resist solvent washout (such as by being polymerized). The glue 26 may also be applied in a clean pattern that can be visualized by human eyes or imaging equipment. A glue pattern may be on the top most vulnerable surface, or both the top and bottom can have glue patterns. With features such as this, attempts to recycle the inlay will be visually detectable. At the same time, the inlay and the MTP inside may be mechanically stable and easy to manipulate by hand or robotically, so long as handled appropriately.

Figure 14:
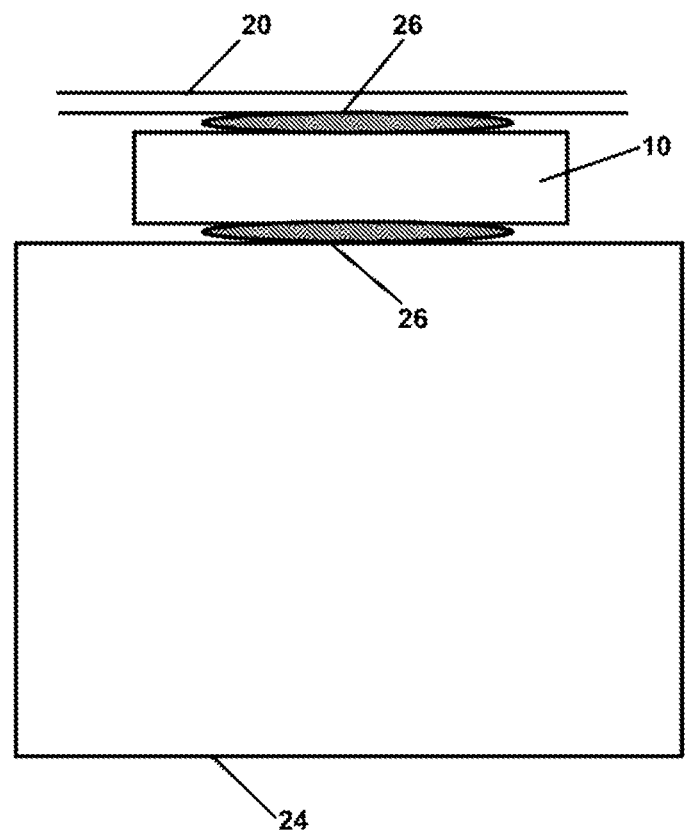
FIG. 14 shows a blown-up view of an example security inlay as fitted to a wine bottle in accordance with some embodiments of the present disclosure.

FIG. 14 shows a blown-up view of an example security inlay as fitted to a wine bottle in accordance with some embodiments of the present disclosure. As illustrated in FIG. 14, the inlay 10, which may appear similar to a thin button, may be glued to both the stopper/cork 24 and the capsule 20 with glue 26. If the bottled wine is original, the MTP ID can be read with a custom ID reader (e.g., wand) or cell phone based attachment, covering, or application, for example. However, the removal of the capsule from the bottle (before the wine bottle is opened) splits the inlay into two parts and at the same time permanently damages the MTP placed inside the inlay 10. The MTP may no longer be read. Thus, validation for the bottle of wine is no longer possible.

The size of the inlay may be selected to cover all or most of the top surface of the stopper 24. In some embodiments, the inlay spans the opening of the wine bottle. The would-be counterfeiter may not be able to dig the inlay out without disabling the MTP. When the bottle is properly opened, the top 10A peels off with the capsule. The bottom does not materially interfere with the use of a corkscrew. In some embodiments, the bottom is made still thinner to further facilitate use of a corkscrew.

A wine manufacturer may receive the inlays from a dedicated factory. The inlay may be glued by the wine manufacturer to the cork, and glued to the capsule. Gluing may be serially conducted, or the glue can be pre-placed on the top and bottom of the inlay. Glue may set by any number of mechanisms, including photo-polymerization (since the inlay in some embodiments is at least semi-transparent), chemical setting, oxidative radiation, and/or other techniques. The capsule may be pressed over the inlay to make sure that the inlay is properly glued.

Alternatively, capsule makers may pre-glue the inlay to the inside of the capsule. Then the wine manufacturer may glue the inside center part of the capsule to the cork. This may be accomplished by having an inlay in the capsule pre-treated with glue (possibly protected with a removable plastic wrap). In this situation, the only thing the manufacturer would need to do to authenticate wine is to remove the wrap before placing the inlay-capsule on the wine bottle.

If the capsule is transparent, the MTP can be read immediately. If a non-transparent capsule is used, an opening may be made in it to read the MTP in the inlay. The opening may be small, such that the inlay 10 may still be well glued to the capsule.

In some embodiments, the capsule top includes a metal foil except for a small window to allow for querying by the MTP photodetector. The window may be covered with a clear plastic coating. In some embodiments, the capsule is a laminate of an opaque material and clear material, with the opaque material missing in the window.

In some embodiments, the MTP may be larger than that sold as the p-Chip® transponder, possibly in one dimension. This size may assure good unsymmetrical adhesion to the top and bottom inlay portions. Authentication is possible over the whole chain of custody, from wine manufacturer through distribution chain to customer. At every step, reading of the MTP ID may validate wine authenticity.

If needed, a connection to a central wine database may be made over internet, the MTP ID is provided to the database and recorded in it with a time stamp and the identity of the MTP reader device. Thus, if proper arrangements are made, the data provider may maintain a history of the bottle of wine. If the final customer wants to check wine authenticity, several approaches may be possible. First, the fact that the vendor may read the ID in front of the customer gives a reassurance. Second, the vendor may search a database and present the history of the bottle to the customer. Third, the customer may enter the MTP ID, use an app on his/her smartphone, and obtain the history of the bottle. Fourth, if the customer has his own ID reader, the customer may verify the information himself/herself.

Thus, provided are a reliable method to authenticate wine or other objects. The disclosed security inlays may be resilient to manipulations involving whole inlays, extremely sensitive to separation of the halves, easily installed, and not noticeable in most situations.

While the invention has been exemplified with wine bottles, it can be used with any container sealed with a capsule or tape such that the inlay containing part of the capsule or tape must be separate from the container. Such uses may include bottles containing pharmaceutical drugs, perfume bottles, or like bottles. Other uses may include labels or other elements placed on or incorporated in plastic, metal, and/or composite materials including CPG Consumer Packaged Goods. For shipping boxes the tape may be adhesive enough that it cannot be removed without marring the base material of the box, e.g., cardboard. Likewise, labels may be adhesive enough that they cannot be removed without damaging the labels and/or the underlying containers.

Where a wine bottle uses a screw top closure, such as a Stelvin® closure, the security inlay may be attached to the bottle on the side under the screw threads and under the capsule. In some embodiments, the inlay bottom may have a curved bottom shape to match the neck of the bottle. In some embodiments, the capsule may be glued to the wine neck in the region of the security inlay.

A capsule may mean tight fitting metal or plastic foil that forms part of the closure of an object such that the object may not be opened without disrupting the capsule. A laminate is a bonding, fusing, adhesion, or the like between polymer layers, or between polymer and fabric layers, such that in the range of anticipated use the laminate is a unitary structure.

The disclosure described herein is of a MTP with signal transmission enhancements and methods of forming or using the same.

Monolithic Security Feature Containing MTP

Monolithic security features may be created by casting, embedding or incorporating MTPs into a substrate via additive manufacturing processes. Such security features can also be made by attaching MTPs to the substrate after they are formed. Monolithic security features may be designed to transport the MTP to or across an external feature whose structure and composition causes the MTP to crack or in some way permanently disable the MTP. As an example, a MTP may be embedded in a heat shrinkable tube that seals a twist cap. The MTP may be deposited such that as the twist cap is unscrewed. The MTP may encounter a ramp or wedge or other structure on the container. The heat shrinkable substrate may be designed to deform while passing the structure, but not fully absorb or dissipate the increasing forces from the structure. As the MTP encounters and moves over the structure, the resistance may force break the MTP or MTP subcomponent thereby rendering it incapacitated.

Multiple MTP Indexed Security Feature

The present invention may use authentication of multiple microtransponders, or combinations of microtransponders and taggants (e.g., QR codes, barcodes, RFID tags, etc.) as matched pairs to establish a higher level of security. All taggants must be present and readable to validate the contents. The taggants may be placed next to one another or at different locations on the surface of the object or within the object, and/or at least two different types of security markings can combined to form a compounded security marking. Failure of any microtransponder or other taggant to respond may indicate non-authentic contents. At least one microtransponder in the multi-level indexing sequence may be a fragile chip that may be rendered physically unable to respond when the container is initially opened. Fragile chips can be produced by post fabrication processing, i.e. thinning of the chip substrate to ensure it breaks when bent or removal from the substrate is attempted. In some embodiments, a method for ensuring chip incapacitation may be implemented by designing a fracture plane or cutting a slot into the chip to disconnect the antennae.

In one embodiment, a physical object (e.g., a container) may be attached with chip A and chip B from a legitimate pairing when both signals respond to interrogation.

In one embodiment, if a physical object is only attached with chip A and chip B is not physically present for interrogation by the reader, a reader may not authenticate this product as the database needs a response from both chips. If the physical object has both chip A and chip B present, but chip B may be broken on opening, the reader may not authenticate this product as chip B is incapacitated.

In one embodiment, similar to the example of the physical object with chip A and chip B, the physical object may have a different pairwise or legitimate pairing indexing via chip C and chip D. While the pairing of chip C and chip D may be legitimate, it may be unique and not equal to the pairing of chip A and chip B. If counterfeiters acquire chips A and C and add them to their packages. The reader may be unable to authenticate the chips as chip A and chip C do not constitute a legitimate pairing.

Light-Triggered Microtransponder (MTP) with Durable Self-Destructive Super Anchors Physical Unclonable Functions (PUF) have been identified and may be adopted as a key element in physical and digital based anti-counterfeit and authentication systems. A PUF is a physical entity that is embodied in a physical structure and is easy to evaluate but hard to predict, even for an attacker with physical access to the PUF. The key element to a PUF is the use of natural and randomly occurring features or properties that can be used as unique distinguishing features of individual objects that are otherwise quite similar. PUFs depend on the uniqueness of their physical microstructure, which typically includes a random component that is already intrinsically present in the physical entity or is explicitly introduced into or generated in the physical entity during its manufacturing. The physical microstructure nature associated with the PUF is substantially uncontrollable and unpredictable. In order to evaluate a PUF, a so-called challenge-response authentication scheme is used. The "challenge" is a physical stimulus applied to the PUF and the "response" is its reaction to the stimulus. The response is dependent on the uncontrollable and unpredictable nature of the physical microstructure and thus can be used to authenticate the PUF, and a physical object of which the PUF forms a part. A specific challenge and its corresponding response together form a so-called "challenge-response pair" (CRP).

In a practical application, a PUF may be interrogated in some manner referred to as a challenge. The PUF has a response to the interrogation that clearly exposes, identifies or documents the unique random feature. The response is then compared to a digital reference. If the unique random feature of the PUF matches the digital reference, the result of the challenge is a positive authentication. If the unique random feature of the PUF is different from the digital reference, the challenge may fail thus rendering the PUF and the corresponding physical object it is attached to as not authentic or fake.

The definition of a PUF may depend on uncontrollable and unpredictable nature of the physical microstructure and focus on a naturally occurring random physical structure or phenomena to obtain uniqueness such that the degree of difficulty to replicate or clone a chip may be exceptionally high. The challenge revealing the random feature of the On-Chip PUF is based on ring oscillation and FPGA architecture, both of which may degrade over time and may not be long term durable.

Despite the wide array of PUF's devised features and in use, there are some significant problems to be solved. While the digital reference of the PUF at its inception may be locked and virtually invariant over time, the physical PUF used to generate the digital reference may begin to degrade immediately. Over time and/or as a result of handling, environmental conditions or conditions of use a legitimate original PUF may eventually have its unique features erode or modified to a point where it may fail a challenge to its digital twin. In this case, a genuine article may be mistakenly identified as a fake or counterfeit item. Thus, there is a need to provide a more durable way to guarantee authenticity of an object.

The present disclosure provides an innovative approach to assigning uniqueness by applying MTPs with and unique IDs to large numbers of similar objects. In some embodiments, non-random functions may be assigned and embedded or incorporated into an object. In some embodiments, the non-random feature may be difficult to reach, and any attempt to manipulate or change the unique feature results in it being disabled or destroyed. Further, embodiments of the present disclosure may be Tamper Proof and/or Self-Destructive with high-level durability and reliable functionality. The combination of super durability with a tamper proof structure may lead to a Super Anchor (SA).

The primary concept of the present disclosure may provide objects (super anchors) with unique embedded features to increase durability of the object. The super durable object may be embedded into the matrix of a chip. Other attempts to exploit a durable approach for IC's, namely On-Chip devices, involve the variant microstructures of the chip itself.

In the present disclosure, a super anchor may have high durability as the MTP ID number is a unique fixed feature that may be integrated into but separate from the bulk media (e.g., chip structure). The unique feature may be isolated from degradation of the bulk. The super anchor may provide features of non-random bus secure. The super anchor may be tamper proof and/or self-destructive in response to attempts to change the unique ID. Further applications of the self-destructive design may be used to ensure authentic packaging such that containers and vessels are not reused to hold counterfeit items. For example, an end use example of self-destructive super anchor can be utilized in a security Inlay.

Figure 15:
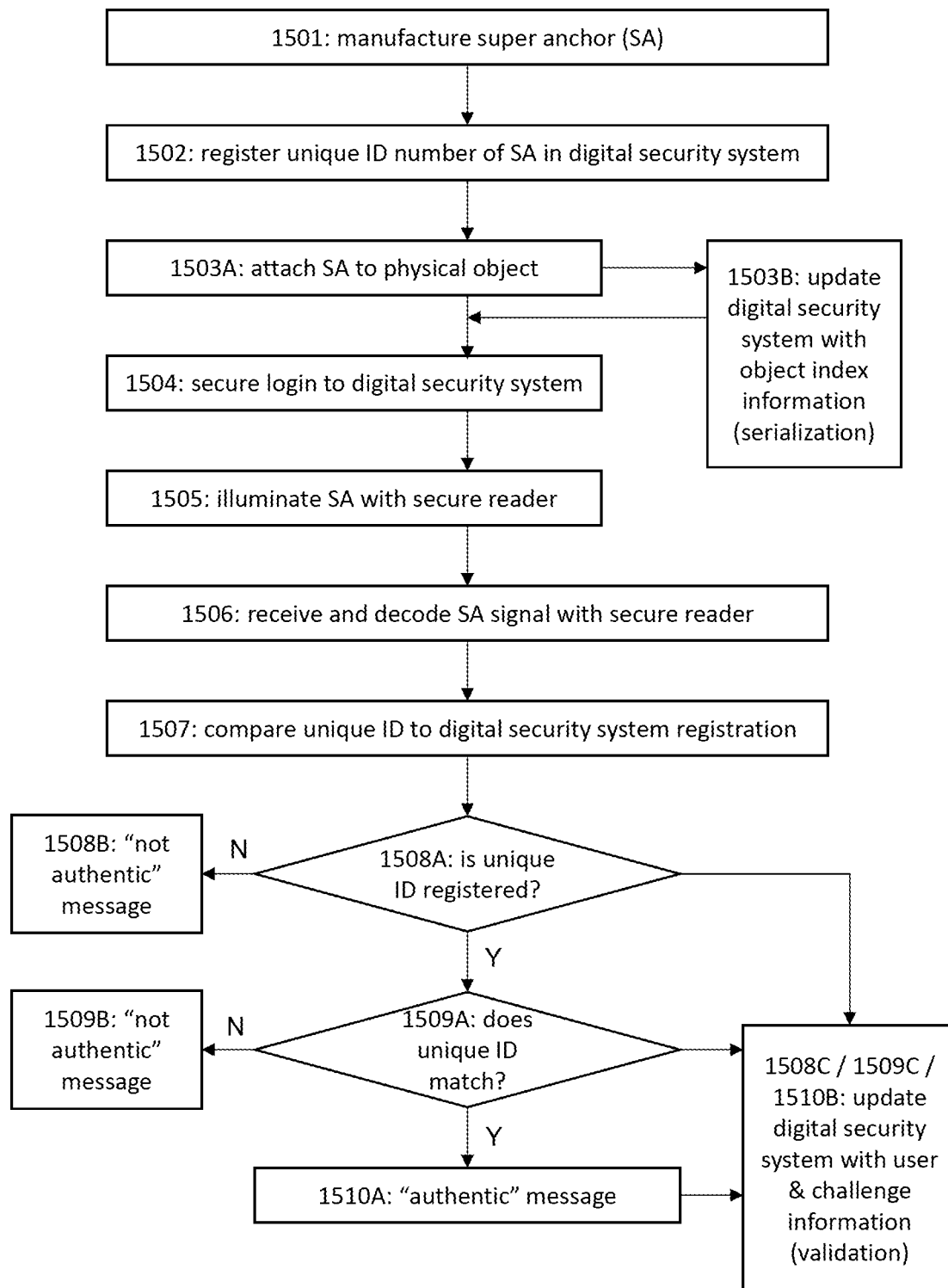
FIG. 15 is a flowchart illustrating an example process configured to utilize Light-triggered transponder with durable self-destructive functions in accordance with some embodiments of the present disclosure.

FIG. 15 is a flowchart illustrating an example process configured to utilize a super anchor for physical object authentication in accordance with some embodiments of the present disclosure. The durable self-destructive super anchor may be utilized for object authentication, object tracing and tracking under a control of a digital security system including a manufacturer database. The digital security system may include one or more computing devices to facilitate in object authentication, object tracing and tracking. The digital security system may include at least a security computing device in communication with a plurality of user computing devices via a network. The security computing device may include a processor, a memory and a communication interface for enabling communication over the network. The digital security system may receive MTP registration information and process MTP ID information from a MTP ID secure reader (e.g., ID reader) via the network.

At step 1501, a Super Anchor (SA) may be manufactured by embedding or incorporating a MTP with a unique ID onto a taggant, a taggant substrate or into a layer of a taggant. The taggant may or may not have PUFs embodied in its physical structure. A Super Anchor may be manufactured by incorporating the MTP into the taggant structure while the taggant may be made or as part of a multilayer manufacturing process. An example of co-manufacturing of taggant and Super Anchor may be casting a thermoplastic tag or label by in mold processing. An example of multi-layering co-manufacture may include lamination of an MTP into a credit card, label or tape whereby the MTP becomes part of the monolithic structure of the tag or object. The tag or taggant formed may be a label, dot, laminate, tape or any physical structure. The primary purposes of the taggant may include: (1) providing a surface to affix the Super Anchor to a physical object for tracking the physical object; and/or (2) acting as a passive or active part of the tamper evident, tamper resistant or self-destructive mechanism.

For example, a Super Anchor may be indicated as a light-triggered MTP with a unique ID attached to or embedded in a chip taggant with Physical Unclonable Functions (PUFs) along with self-destructive features and high durability functionalities.

At step 1502, the unique ID number of the MTP may be registered in a digital security system and/or manufacturer database and be indexed to the MTP.

At step 1503A, the manufactured SA with the unique ID number or unique serial number may be digitally indexed to and attached to a physical object. Said Super Anchor may or may not have acceptable means of attaching it to the physical object as part of its structure and composition. The means, method and process of adhering a Super Anchor to a physical object may vary widely depending on the composition and conditions of use for the physical object receiving the Super Anchor. Super Anchors may be attached directly to a physical object with known materials and processes such as adhesives, sealants, waxes, tapes and films. Glue or other adhesive may set by any number of mechanisms, including photo-polymerization, chemical setting, oxidative radiation, and/or other techniques. Said materials may have immediate or latent action. Attaching materials may be reactive. Reactive materials may be activated by pressure, chemical, thermal light, sound or other radiation sources. Such materials and processes are illustrative, but not limiting. Super Anchors may be sewn or injected into an object.

In some embodiments, a Super Anchor may be supplied and used as an unattached object with a reactive site or substrate that may have been modified for specific attraction and binding of chemical and/or biological species with or without subsequent treatment, interrogation and identification of the attaching species. After identification, the binding species can be removed, thereby regenerating the Super Anchor. As such, the Super Anchors may be able to form platforms and scaffolding for random or precision growth sequencing in automated or semiautomated processes. An unattached Super Anchor with or without reactive sites or substrates may be dispersed in a continuous medium such as a fluid. Dynamic object information of the Super Anchor can be discerned by capturing its unique ID at one or more sites in a closed vessel. The dynamic object information can be used to determine flow characteristics of the continuous medium. Real time rheological and tribological data may be calculated. Algorithms and software for Computational Fluid Dynamics may be developed and used to document flow dynamics and velocity gradients in high detail. Modeling of industrial material flow and reaction conditions, documentation of mixing equipment capability and fluid handling system design can be greatly improved.

At step 1503B, data associated with the physical object stored in the digital security system may be updated with object index information so that the physical object can be searched and read with the unique ID number and product data in the digital security system. The product data may include product serialization or identifier associated with the physical object, such as radio-frequency identification (RFID), QR Code, etc.

At step 1504, when a user receives the physical object attached with the manufactured SA, a user may securely log into the digital security system via a user computing device to initiate an authentication process for the physical object.

At step 1505, a secure reader (e.g., ID reader) may be utilized to illuminate the SA attached to the physical object and receive the SA signal.

At step 1506, the secure reader may receive SA signal and decode the received SA signal to obtain the unique ID number or serial number indexed to the SA. The user computing device may execute an application to communicate with the secure reader to receive the decoded ID of the SA associated with the physical object.

At step 1507, the user computing device may communicate with the digital security system via network and send the decoded ID of the SA to the digital security system. The digital security system may compare the decoded unique ID associated with the physical object to the ID numbers stored in the digital security system.

At step 1508A, based on a comparison result, the digital security system may determine whether the decoded unique ID number is registered.

At step 1508B, in response to determining that the decoded unique ID is not registered, the digital security system may generate a message of "Not Authentic" for displaying on a user interface of the user computing device.

At step 1508C, the digital security system may update the data associated with the physical object with the user and challenge information for an object authenticity validation.

At step 1509A, in response to determining that the decoded unique ID number is registered in the digital security system, the digital security system may further determine whether the decoded unique ID number matches a stored ID number associated with the physical object.

At step 1509B, in response to determining that the decoded unique ID number does not match a stored ID number associated with the physical object, the digital security system may generate a message of "Not Authentic" for displaying on a user interface of the user computing device.

At step 1509C, based on the determined authentic result of 1509A, the digital security system may update the data associated with the physical object with user and challenge information for an object authenticity validation.

At step 1510A, in response to determining that the decoded unique ID matches a stored ID indexed to the physical object, the digital security system may generate a message of "Authentic" for displaying on a user interface of the user computing device.

At step 1510B, based on the determined authentic result of 1510A, the digital security system may update the data associated with the physical object with user and challenge information for the object authenticity validation.

Embodiments of the present disclosure may provide the MTP with super durable super anchors utilized for tagging, authentication and anti-counterfeiting of physical objects.

In some embodiments, the manufactured Super Anchor (SA) may be combined with RFID or QR code technology and certain encryption technology to further enhancing tracing and anti-counterfeit protection of the physical object.

In some embodiments, a manufactured SA may be printed as a label on any types of surfaces of physical objects. In some embodiments, the manufactured SA may be printed as a label to replace RFID or QR code for special security document transfer.

Embodiments of the present disclosure may provide the MTP with super durable super anchors combined or integrated into business systems, database of digital security systems, distributed ledger, blockchain, blockchain interoperability as well as interoperability of object and financial based blockchains.

In some embodiments, storing the secured unique ID number of a manufactured SA indexed to the attached physical object may be implemented by storing the registered unique ID of the SA and related data associated with the physical object to a blockchain or a blockless distributed ledger. In this way, the registered unique ID and related data may be saved and stored in such a way, that it is substantially impossible to tamper with it. Furthermore, storing the secured registered unique ID and related super anchor data to a blockchain or blockless distributed ledger may allow for object authenticity validation and tracing from remote, for example by an authorized receiver along a supply chain of the related physical object or group of objects.

In some embodiments, the above process may be adapted for use in analyzing flow characteristics and/or other features of a continuous medium. For example, at step 1503A, the SA may be dispersed in the continuous medium (e.g., rather than being physically attached to a solid medium). Then, the SA may be illuminated and may respond, as described above, a plurality of times. Each time may be recorded, and a position of the SA within the medium may also be recorded. These time-stamped SA positions may be processed to determine at least one fluid characteristic of the continuous medium, as noted above.

Microtransponder-Based Smart Paper Contracts

Authenticity of paper based credentials may not be secure. Massive fraud may occur with authenticating paper based credentials. For example, a diploma may be ordered online from a University anywhere in the world and may be printed and sent directly to anywhere. False credentials may be used and sent to physicians, psychologists or other professionals for a variety of nefarious purposes. Authentication of documents normally takes time and costs consumers significant amounts of money, which needs to be avoided. Further, record searches may delay home and real estate transaction by many days, impeding business flow and revenue generation.

P-Chip® MTP (e.g., configured as a durable self-destructive super anchor in some cases) may be utilized to implement MTP-based smart paper contracts. Embodiments of the present disclosure describe techniques of the MTP-based paper contracts which may provide low cost registration and authentication of processing devices while increasing traceability and security of digital or printed paper items.

MTP-based smart paper contracts may eliminate multiple steps and cost of creating secure, authentic digital records and smart contracts. MTP-based smart paper contracts may provide low cost registration and authentication of printers & marking devices increase traceability and security of printed items. MTP-based smart paper contracts may use machine tokenization for service payment, etc. Unlike watermarks embedded in paper documents and credential substrates or print based security features from special dyes or pigments and 2-dimensional codes such as QR and data matrix codes, P-Chip® MTP are not easy to duplicate and provide a highly affordable option for digital authentication.

Adding a document or physical record to a digital security system or similar functional database, data lake, or computer based archival and verification system requires the document be scanned and a unique ID or serial identifier added. Smart paper contracts based on P-Chip® MTP may have a low cost energy activated identifier attached and/or embedded in the substrate of the MTP that confers to the document a unique and physically unalterable ID number.

As used herein, the term "smart contract," "smart paper contract," "printed item," or "printed object" may include all types of printable items, but not limited to, contracts, financial transactions, transcripts, certificates, checks, secure credentials, medical records, quality records, deed searches on homes, and title searches on automobiles, boats agricultural equipment and recreational vehicles, etc. For example, MTP-based smart paper contracts may be utilized to create documents, such as secure credentials, contacts, certificates, quality records, etc. The specific raw material and product characteristics may be documented by certificates of analysis, medical records, genomic certification such as breed or certified seed.

As used herein, the term "paper" is used as an easy to understand, but not limiting embodiment of the present invention which may include all print related substrates such as synthetic paper, films, cardboard, plastic, metal wood and composites. Furthermore, concept of the present disclosure may encompass printing of labels and packaging as novel ways to create secure "smart labels", secure "smart tags" and secure "smart packages". The present invention may encompass both conventional 2D printing as well as 3D printing processes for the above mentioned substrates and printed items.

Figure 16:
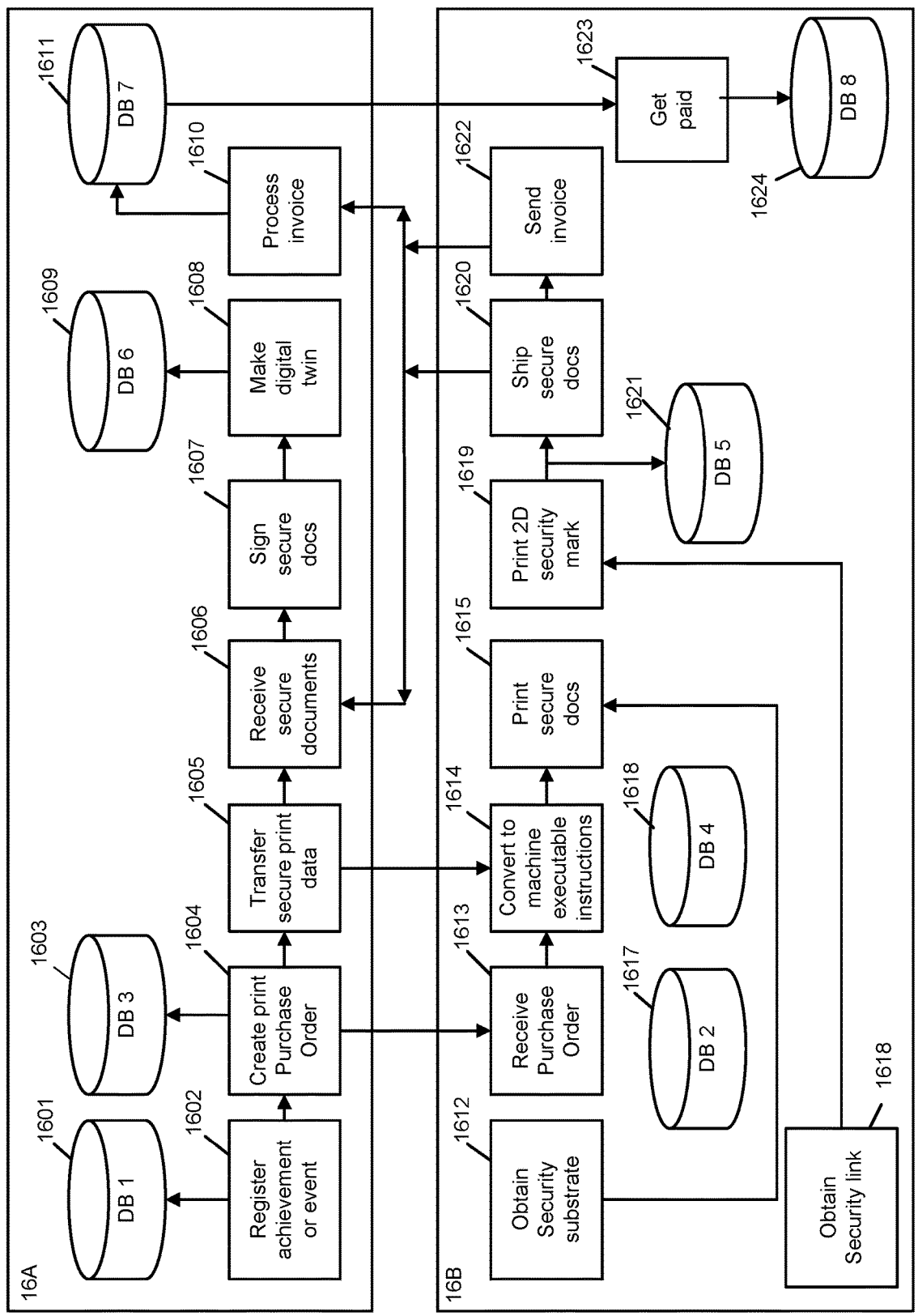
FIG. 16 illustrates a diagram of a process of implementing a smart paper contract in accordance with some embodiments of the present disclosure.

FIG. 16 illustrates a functional diagram of implementing a smart paper contract in accordance with some embodiments of the present disclosure. As illustrated in FIG. 16, a functional part 16A may include databases and operations associated with sender and receiver activities. A smart contract sender (e.g., document sender) may register achievement or event with a digital security system (at block 1602) via a first computing device. The data of the sender and document may be stored as client recodes in database 1601 (e.g., DB 1). The sender may create a print purchase order (at block 1603) and store the order and related financial data as client financial data in database 1604 (e.g., DB 4). The smart contract sender may transfer secure print data to a smart contract receiver (e.g., document recipient) (at block 1605).

As illustrated in FIG. 16, a functional part 16B may include databases and operations performed by authorized printer(s) and marking device(s) associated with the digital security system.

At block 1613, authorized printer(s) and marking device(s) may be registered in the digital security system with respective assigned security serial numbers. The authorized printer may receive the purchase order form the sender. The authorized printer may convert the secure print data associated with the purchase order to machine executable instructions (at block 1614). The received secure print data and purchase order may be stored in database 1616 (e.g., DB 2). The authorized printer may obtain security substrate (at block 1612) and print the secure documents (at block 1615). The security substrate (at block 1612) and operations of printing the secure documents (at block 1615) may be stored in database 1617 (e.g., DB 4). The authorized marking device may obtain security ink (at block 1618) and be configured to print a 2D security mark on the secure documents (at block 1619). The terms "security substrate" and "security ink" reference legacy materials and processes for creating a secure document by printing. There may be many commercially available substrates and inks. Examples of security substrates may be paper that has watermarks or embossed structures. Another example may be a paper that has been pre-printed with an "invisible ink". Under normal solar illumination, the ink does not reflect in the visible spectrum. When subjected to UV light, the pre-printed lettering or mark would down convert the higher energy light into the visible spectrum and be viewable to an observer. Papers can be natural or synthetic based, hence the more generic term "substrate" may be used. Synthetic papers may be more expensive and can be made with specific spectral responses designed into their bulk properties and provide another level of security. Incorporation of color changing (gonio-apparent) fibers into the paper or substrate to be printed may add another layer of security as the threads exhibit a unique color reflectance that may change as the angle of observation of the document is changed. The color change is a function of the material. The material is very expensive, and in the case of official state produced documents it may be a controlled substance. Security inks may be specific physical structures of pigments or dyes that may yield changing reflectance (observable color) to humans and/or machines. Both the security substrate (block 1612) and security inks (block 1618) may be raw materials that are procured by the printer. Customers have the ability to specify the security substrate and ink or any combination as part of their print order to obtain a secure document.

2D security markings are current state of the art printing techniques. In addition to using secure inks and combinations of secure inks, the printed design may have intentional structures that are printed in ultrahigh detail. Careful inspection or low power magnification may reveal the microstructure that a simple counterfeiter may not be aware of or able to make. 2D security marks can also be PUF's according to the original definition by Virginia Technical University in that their micro-structures are a function of ink droplet splatter, absorbance into the print substrate and variation in drying. The 2D structure may be photographed and digitized. Digital features may be identified through combined edge finding algorithms for shape and combining with other image factors such as area, color and luminance.

The digital file may be given a unique ID. The unique ID and file image may be archived in a database and indexed to the digital file. Further, a digital image capture may be compared to the archived image to determine authenticity as a PUF challenge response sequence.

Recent developments to attach or embed RFID devices in print paper afford another level of security for printed documents whereby the RFID tag number becomes the digital identification number or part of the digital ID for the printed document. RFID enabled sheet papers are available for digital print platforms like HP Indigo printers and others. In some cases, RFID tags may be attached to documents after printing. The benefits of using RFID technology for authentication of printed documents are consistent with their use in other security media. The downside of this security mechanism is that it can be cloned by non-authorized entities, it is not durable in use, and it is expensive. Embodiments described herein may be used with RFID enabled sheet papers in addition to, or in place of, the 2D security marks described above The printed secure documents with the 2D security mark and/or embedded RFID tag may be shipped to the document receiver (at block 1620) and the related records may be stored in database 1621 (e.g., DB 5). The secure documents with the 2D security mark may be sent along with the invoice to the smart contract receiver (at block 1622). The smart contract receiver may receive both digital copies of secure documents via emails or text messages over a network and printed secure documents with 2D security mark via mail (at block 1606). The smart contract receiver may receive and sign the secure documents (at block 1607). A digital twin of the signed documents may be created (at block 1608) and stored in database 1609 (e.g., DB 6). The smart contract receiver may process or pay the invoice associated with the received documents via a second computing device over a network and store the transaction records in client financial database 1611 (e.g., DB 7). The financial transaction record of the paid invoice may be sent via the second computing device to the digital security system (at block 1623) and stored in database 1624 (e.g., DB 8). The MTP-based document security measures described herein may be used in place of traditional 2D security marks and/or embedded RFID tags or in combination with them. In either case, the smart paper contracts formed using the embodiments described herein may be more durably secure than documents secured by traditional 2D security marks and/or embedded RFID tags alone.

Generating a Secure Document Smart Contract with Blockchain Integration

In some embodiments, blockchain may be used to apply a predetermined collision resistant hash function for tracing and tracking a smart contract document. As used herein, the collision resistant hash function refers to a special type of hash function, i.e. a mathematical function or algorithm that maps data of arbitrary size to a bit string of a fixed size of a hash value, which is designed to also be a one-way function, i.e. a function that is easy to compute on every input, but hard to invert given the image of a random input. Preferably, the collision resistant hash function is designed such that it is difficult to find two different data sets d1 and d2 such that hash(d1)=hash(d2). These are hash functions for which a certain sufficient security level can be mathematically proven. In the present security solution, the security of the cryptographic hash function is further improved by the fact, that the MTP ID number reading of a marking comprising a smart anchor, particularly of a composite security marking, as disclosed herein, takes place at a particular location and time, where the physical object bearing the marking is actually present at such location and time. This can be used either to increase the absolute level of security that can be achieved or to allow for the use of the collision resistant hash function working with smaller data sets, e.g. shorter data strings as inputs and/or outputs, while still providing a given required security level.

By utilizing blockchain technology, the MTP ID may be used along with a collision resistant hash function to generate a smart contract. Generating a smart contract may involve in a multi-level indexing process for object authentication, object tracing and tracking. For example, combining the unique MTP ID number 1 associated with each printable page in a box of Smart Paper with the unique ID number 2 associated with a paper box containing all the Smart Paper may allow the smart paper to arrive at the printer with a predetermined identifier able to be immediately integrated to a collision resistant hash function of the blockchain upon printing. Further. in the present disclosure, each authorized printer and/or marking device may have a its own unique identification ID number 3. The unique MTP ID 1 from the paper may be combined with the unique ID 2 of the paper box and a unique serial ID number 3 of the authorized printer or marking device. Further, all related MTP IDs may be applied to a collision resistant hash function to create a similar blockchain enabled identification. This identification may be used as a further level of security to register the printer or marking device for machine tokenization payment. In some embodiments, the MTP unique ID 1 of a smart paper may be used to register fax machines and increase security of fax machines for data transmission.

Figure 17:
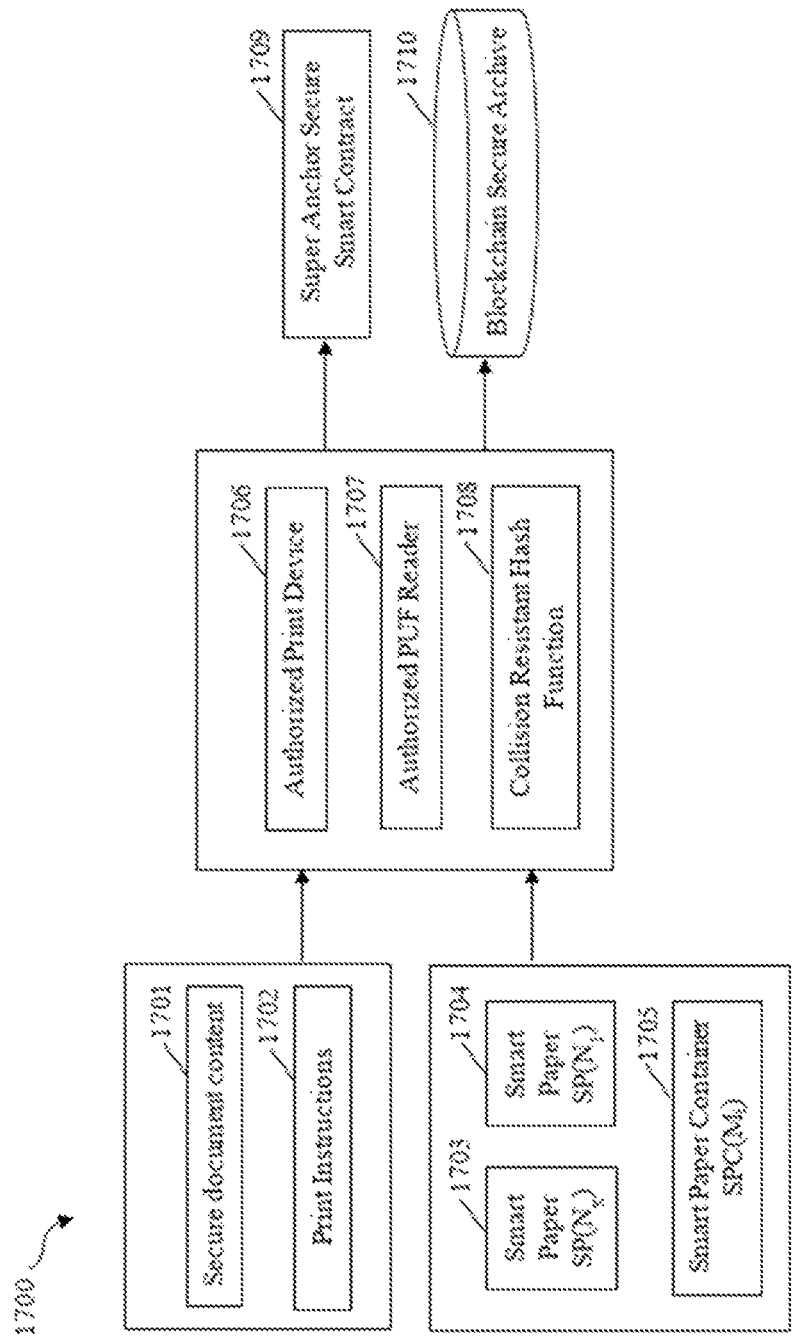
FIG. 17 illustrates an example system diagram of generating a secure document smart contract with blockchain integration in accordance with some embodiments of the present disclosure.

FIG. 17 illustrates an example system diagram of generating a secure document smart contract while integrating with blockchain. The example system 1700 may include a plurality of smart paper SP(Ni) 1703, a smart paper container SPC(Mi) 1705, an authorized print device 1706, an authorized p-Chip PUF reader 1707 (e.g., p-chip identifier reader), and a blockchain secure archive 1710. The plurality of smart paper SP(Ni) 1703, a smart paper container SPC (Mi) 1705, and an authorized print device 1706 may be embedded with respective super anchors configured with respective p-Chip MTPs and super anchors. The authorized p-Chip super anchor reader 1707 may be registered with a serial number in a digital security system. The authorized p-Chip super anchor reader 1707 and a collision resistant hash function 1708 may be incorporated into the digital authorized print device 1706.

The p-Chip unique serial number of authorized p-Chip super anchor reader 1707 may be used for generating a corresponding hash value by a collision resistant hash function 1708, thereby adding an additional layer of security. While it may be fully integrated with the printing work flow in some embodiments, the collision resistant hash function 1708 may be performed electronically off the digital authorized print device 1706 in real time by a printing entity.

In some embodiments, the digital authorized print device 1706 may be configured to receive secure document content 1701 and print instructions 1702 from users over a network to generate a secure document smart contract 1709. The digital authorized print device 1706 may be configured to load a smart paper SP(Ni) 1703 from the smart paper container SPC(Mi) 1705 to create a printed article for the secure document smart contract 1709. The digital authorized print device 1706 may communicated with and automatically control the authorized p-Chip super anchor reader 1707 to read the super anchor IDs of the loaded smart paper SP(Ni) 1703 and the smart paper container SPC(Mi) 1705.

In one embodiment, the digital authorized print device 1706 may be embedded or incorporated with a Super Anchor including a MTP with an ID number for elevating the security status of the print device 1706. The incorporation may allow the digital authorized print device 1706 and its output to be recognized as a verified and trusted source.

In one embodiment, the digital authorized print device 1706 may be registered through a blockchain trust center and may allow all subsequent prints to be secure inside the blockchain, thereby eliminating a costly, time consuming step. A collision resistant hash function 1708 may be applied to a p-Chip MTP ID number associated with the digital authorized print device 1706, a print instructions 1702, print time and print date stamps generated by the printing device 1706 for generating a high secure document smart contract.

In one embodiment, the incorporation of p-Chips into the paper and paper container may provide 2 additional levels of security as both associated to unique super anchors with respective unique ID numbers. For example, a smart paper SP(Ni) 1703 may be generated by embedding a p-Chip MTP with 2D super anchors into a print paper and linked to a 2D p-Chip ID numbers (e.g., a first and a second IDs. A smart paper container SPC($M_i$) 1705 may be generated by embedding a third p-Chip MTP into a paper container SPC($M_i$) 1705 and linked to a third ID number. The digital authorized print device 1706 may be embedded or incorporated with a MTP with a fourth ID number. The collision resistant hash function 1708 may be applied to smart paper SP(Ni) 1703 and smart paper container SPC($M_i$) 1705, and its partners or its license at time of manufacture to create pre-manufactured smart contracts for printing. Thus, existing physical records scanned for digital archival purposes or newly created records may immediately become partial data of the smart contracts.

The collision resistant hash function 1708 may be applied to other entity or document specific information and may greatly increase security at exceptionally low cost. For example, there are different reasons to lower the cost with increased document security.
1) It may not be cost effective to use more than one print based super anchor.
2) Using a 2D security marking and p-Chip ID numbers from smart paper 1704, one p-Chip ID number from paper container 1705 and one p-Chip ID number from digital authorized print device 1706 may provide multiple level (e.g., 4 levels) of unique identification to a single security document.
3) Replacement of an existing 2D security marking by 1 to 3 or more p-Chips may greatly reduce operating costs for the print device and the cost of secure prints for end users while greatly improving the document security.

In some embodiments, p-Chip authentication may be applied to individual print cartridges for security grade inks that may be associated to different brands. Using a unique p-Chip ID number of the ink cartridge along with a different p-Chip ID number for the print device may be another way to greatly increase security for an existing 2D print based systems.

In some embodiments, the smart paper and smart paper container may be labeled with material lot number and container number. The lot number may have unique Certificate of Analysis (CoA) information that may identify multiple physical constants for the batch of product and/or material. The respective p-Chip ID numbers indexed to or associated with the smart paper and smart paper container may be exchanged with or configured to include the material lot number and the container product number of the smart paper container. In one embodiment, any number of unique and variable physical data points for the batch may be used as PUFs. Further, a Super Anchor as described above may be added to the 3D print device for generating a secure 3D print.

Authentication of 3D Printed Object with Embedded MTPs Utilizing the Process of Converting to Smart Contract The present disclosure provides a cost effective method and system for the identification and authentication of parts and components created by additive manufacturing. The explosion of additive manufacturing processes, equipment and techniques may hold great promise to revolutionize physical manufacturing of objects. Increasing speed while reducing equipment capital cost and cost per unit of printed objects. Reduction of costs may have made it feasible to create and sell non-original, counterfeit products. The negative effects of counterfeiting may be well established including revenue and tax loss and increased warranty claims. While these detrimental consequences have massive negative repercussions on a global scale, an even larger problem may exist related to human health and safety of fake parts leading to substantial injury and death of humans and animals.

Attaching a P-Chip® MTP to a printed object may provide the object with a unique identification number that may be protected against forgery by utilizing the above-described challenge response mechanism. As described above, the P-Chip® MTP may be used to convert the printed object to a Smart Part, and/or a Smart contract by methods outlined in Smart Paper as described above.

P-Chip® MTPs can be incorporated directly into a printed object by placement on the print stage. For example, the MTPs may have and adhesive or tape that is activated by methods based on mechanical, thermal, or radiation to fuse into the object. The MTPs may be incorporated using a sacrificial medium that may be destroyed by the printing process, sub-process or post printing process. P-Chip® MTPs may be incorporated directly into a printed object by a tape, asset tag or label. The security inlay can be used to deter MTP substitution.

In some embodiments, P-Chip® MTPs may be incorporated as subcomponents with the P-Chip® being attached or embedded in the matrix by a separate process mechanically or by additive manufacturing. For example, one manifestation may be a thin base with an embedded MTP. The base may be made of the same material, or compatible with the material of the object being printed. Printing may occur on top of the thin base. Alternatively, the thin base may be attached by an adhesive, coating or polymeric material of organic, inorganic or hybrid composition. In some embodiments, similar materials and shapes such as pegs, tabs, labels, caps or any other structural elements of the finished part, component, sub-component or assembly may be used with embedded MTPs. In some embodiments, structures may be attached, fused to the printed part as an exterior surface. MTPs and components containing MTPs may be purposefully overprinted to enable durability of the MTPs during service life as a covert security feature.

MTPs may be added to specific features of the printed article that may provide mechanical protection during service or act as an overt or covert function for reading during distribution sales and service life of the article. Existing robotics may be used to chip the object immediately after printing as a separate station in the workflow or separate process by any means.

As described above, MTPs may be printed or attached to objects and be combined with 2D security markings, RFID's and other known PUF technologies for an added layer of security to the objects. The MTPs may be manufactured as labels printed on the objects. The MTPs may be embedded in paper documents as smart contracts.

Various materials may be used in end use applications, such as additive manufacturing of metals, ceramics, plastics, polymeric materials, single component, plural component mixtures and combinations thereof, including medical and dental implants for humans and animals.

The 3D printed object by the MTPs may require particular conditions of use, range of efficacy or limitations, such as temperature range, flexibility characteristics, etc. Bulk properties of print materials like flexibility, bend radius and coefficient of expansion may be carefully considered to ensure no stresses introduced that may incapacitate subcomponents, destroy the MTP chip or cause it to be ejected from the part in service. For example, a MTP label may be printed on the objects applied with RFID to provide flexibility and additional layer of security to the objects. For example, depending on the materials and methods used in production of the transponder antenna and the chip bonding method and orientation of the transponder on the substrate, every passive RF transponder may have a minimum (e.g., 3-inch diameter) allowed bending radius (radius of curvature). Flexing or bending the finished Passive RFID transponders media to a radius smaller than this minimum radius at any point in the application process may result in RFID failure either from antenna fracture or breaking of the chip-antenna bond. The RFID label manufacturer may provide the value for the minimum-bending radius. Objects printed with MTP label may have an extra bend flexibility over the normal RFID label. For example, p-Chips have been successfully attached and read on ¼ inch automotive brake lines.

Specific issues for additive manufacturing of ceramics and metals may apply. All materials and equipment common to additive manufacturing may be utilized for the 3D printed object by MTPs. For example, laser marking of polymeric materials may be used to make identifications and 2D security marks. Laser marking is a commercial process where laser marking pigments are embedded in a matrix (polymeric, paint, adhesive, plastic etc.).

The pigments may be randomly dispersed in the composite material. The composite material may be irradiated with high energy radiation and the pigments heat up and char the surrounding continuous phase of the part or coating as a response thereby changing color. Controlling the radiation beam may produce symbols, structures or identification numbers that are embedded in the part or at the surface. While laser marking may be an affordable way to add a part number to an object, laser marking pigments, radiation sources and automation controls are ubiquitous. This is not a very secure marking. If one uses laser marking and characterizes the random features as described for printing a smart contract, they may create a super anchor, which may be more secure than a simple laser mark. These methods may be widely used in carbon based materials and composites.

Another method of laser marking is direct metal ablation. High power lasers may erode metal surfaces and change the surface color (anodization) leaving a permanent mark.

Super Anchors may replace laser marking and 2D security marks for plastics and organic based objects. They may be used for defensive security purposes. 3D printers for ceramics and metals may have a high power laser for sintering. In some embodiments, super anchors may be attached to inorganic 3D printed articles with 2D laser marks. In some embodiments, super anchors may be attached to inorganic 3D printed articles to replace 2D laser marks and increase security.

In some embodiments, the light activated MTPs may include longer waveforms being developed for IC signaling like terahertz.

In some embodiments, acoustics signal may be utilized instead of light for transmitting and reading MTP chip IDs. Compatible equipment and circuit elements including modulation-demodulation circuit, coding-decoding circuit, MTP reader may be developed via piezoelectric devices on the MTPs chip to be associated with corresponding acoustics signals.

Further, a mobile application may be provided to be compatible with a corresponding MTP reader for scanning the MTPs attached on the physical objects. The mobile application may be executed to communicate with a digital security system for registering physical objects attached with MTP labels or embedded with MTPs. The mobile application may be executed to communicate with a digital security system for tracking and authenticating physical objects reiterated in digital security system. The mobile application may be executed to read MTP IDs printed on the objects with a corresponding MTP reader and send the read IDs directly to the digital security system or similar functional database for object authentication processing described in FIG. 15.

Enhanced Read Distance Microtransponder (MTP)

The current generation MTP may have limited read capability when attached directly to metal substrates. Modulated light required to activate solar cells of a MTP may interact with the metallic substrate which may generate eddy currents in the metal. The generated eddy currents may reduce the RF signal intensity response from the MTP. The ability to successfully acquire and decode the RF signal containing the unique identity number of a MTP is a function of a signal distance between the MTP and its reader.

Embodiments of the present disclosure describe techniques of enhancing read distance for MTPs by eliminating the eddy currents. Signal distance for P-Chips directly attached to metallic surfaces may be reduced by up to 30% compared to non-metallic substrates. The enhanced read distance MTP may be embedded with durable self-destructive PUF functions as described. It may be possible to build a physical gap between metal substrates and objects effected by eddy currents. Such schemes may rely on tapes, shims or filled polymeric adhesives, laminates or films that are external to Integrated Circuit (IC) manufacture and structures. Given the wide range of substrates and attachment methods for end use applications of a P-Chip® MTP, a single high volume, affordable solution may not be possible for post manufacture isolation of the MTP from the metallic substrate. It may be highly advantageous to achieve the resistance to eddy currents from metal substrates as part of the on-chip structures.

In some embodiments, successful elimination of eddy currents may be achieved with active or passive materials and or combinations thereof. Active materials may absorb, scatter, destroy or reflect the Eddy currents away from the chip and its signals. Filler materials such as ferrite are also known to act as active materials. Passive materials may not interact at all with the eddy currents and provide a physical separation between the substrate and the IC signals. Glass, ceramics and inorganic media are known materials providing passive separation and are compatible with IC manufacturing.

In some embodiments, the base or near base layer of IC design may be fabricated with a passive material, or filled with an active material. A base layer is formed post foundry by attaching passive or active substrate to the MTP chip.

Various methods or technologies may be utilized for the base layer of IC design, but not limited to the methods or technologies, including:

1) Physical build processing by vapor phase or chemical deposition. While most passivation layers are built to eliminate corrosion of the IC & components, extending the thickness of the back of the chip by deposition of a non-conducting inorganic layer acts as a physical spacer to isolate the IC and its circuitry from the metal substrate causing interference.
2) Physical layer build processing from liquid media with subsequent thermal or radiation curing in a field of polysilazane/polysiloxane chemistry. The two chemistries described are capable of making durable non-conducting films and structures with excellent adhesion to other inorganic surfaces. Such sol-gel systems can be applied as a liquid coating by casting, spraying, dip or spin based applications to precise films.
3) Attachment of active or passive monolithic layer to wafer by liquid, gel or solid media followed by thermal or radiation curing in a field of polysilazane/polysiloxane chemistry. The same sol-gel systems may be used as adhesives to bind other structures such as a glass sheet to the back of an IC wafer. In some embodiments, a passive monolithic layer may be glass or a filled glass structure.
4) Hybrid organic-inorganic polymeric matrices may be considered as they have greater flexibility, and may be an organic route to lower temperature applications. One drawback of sol-gel films is that they may be brittle. Adding small amounts of organic materials into the inorganic sol-gel system may decrease brittleness. A material tradeoff of creating a hybrid sol-gel is that the high temperature resistance is degraded.

All end use applications may be directed to metal or contain metal filled layers or particles.

The present disclosure may identify known or perceived conditions of use, range of efficacy or limitations. While high temperature service conditions are key features of a P-Chip® MTP, metallic objects used in low or ambient temperature applications such as asset tagging are equally important. Therefore, organic-based eddy current elimination schemes may also be utilized for low to ambient temperature applications. During the manufacturing process of MTP with the enhanced signal distance, various material may be used, but not limited to inorganic films, coatings and adhesives, high temperature hybrid organic-inorganic matrices and materials, and high temperature organic insulating materials, etc.

Certain products or technologies that might be used in combination with the disclosed MTP. Various elements, devices, modules and circuits are described above in association with their respective functions. These elements, devices, modules and circuits are considered means for performing their respective functions as described herein.

The invention can be described further with respect to the following Numbered Embodiments:

Embodiment 1. A transponder, comprising: (1) one or more photocells configured to receive electromagnetic radiation; and (2) a clock recovery circuit comprising a photoconductor, the photoconductor comprising a source terminal, and a drain terminal coupled to a power source, the photoconductor having a resistance configured to vary as a function of received radiation intensity, the clock recovery circuit configured to generate a recovered clock, optionally with one or more features of Embodiment 9 or 19.

Embodiment 2. The transponder of a Transponder Embodiment, further comprising a reverse antenna system connected to at least one photocell and configured to transmit data.

Embodiment 3. The transponder of a Transponder Embodiment, wherein the photoconductor is configured to produce a modulated voltage signal at a source terminal of the photoconductor in response to a modulated radiation signal incident on the photoconductor.

Embodiment 4. The transponder of a Transponder Embodiment, wherein the clock recovery circuit comprises: (a) an amplifier coupled to the source terminal of the photoconductor via a capacitor for receiving the modulated voltage signal and outputting an analog signal generated from the modulated voltage signal; and (b) an inverter coupled to the amplifier and configured to digitize the analog signal of the amplifier to generate the recovered clock.

Embodiment 5. The transponder of a Transponder Embodiment, wherein the clock recovery circuit comprises a resistor comprising a first terminal connected to the source terminal of the photoconductor and a second terminal connected to a ground, and wherein the modulated voltage signal at the source terminal of the photoconductor is determined by a ratio of the resistance of the photoconductor and the resistor.

Embodiment 6. The transponder of a Transponder Embodiment, wherein the transponder has a unique identifier.

Embodiment 7. The transponder of a Transponder Embodiment, wherein the transponder is a monolithic integrated circuit sized about 2 mm or less×2 mm or less×0.2 mm or less in thickness.

Embodiment 8. The transponder of a Transponder Embodiment, wherein the electromagnetic radiation includes one or more subsets of the sub-terahertz portion of the electromagnetic spectrum.

Embodiment 9. A transponder, comprising: (I) one or more photocells configured to receive electromagnetic radiation; and (II) a reverse antenna system connected to at least one photo cell and configured to transmit data, optionally with one or more features of Embodiment 1 or 19.

Embodiment 10. The transponder of a Transponder Embodiment, wherein the transponder is configured to transmit its identifier with a modulated current through the reverse antenna system.

Embodiment 11. The transponder of a Transponder Embodiment, wherein the reverse antenna system comprises one or more antennas and a plurality of electronic switches, the system configured to conduct a bi-phase transmission to direct current flows through the antennas and the plurality of electronic switches.

Embodiment 12. The transponder of a Transponder Embodiment, wherein the bi-phase transmission is conducted such that a "1" bit digital signal is transmitted with a first current flow through one of the antennas in one direction and a "0" bit digital signal is transmitted with a second current flow in an opposite direction in one of the antennas.

Embodiment 13. The transponder of a Transponder Embodiment, wherein the reverse antenna system comprises a forward antenna and a reverse antenna.

Embodiment 14. The transponder of a Transponder Embodiment, wherein the reverse antenna system comprises a single antenna.

Embodiment 15. The transponder of a Transponder Embodiment, wherein the reversible antenna system is configured to conduct the bi-phase transmission to transmit transmitted a "1" bit digital signal and a "0" bit digital signal with substantially the same power.

Embodiment 16. The transponder of a Transponder Embodiment, wherein the reverse antenna system comprises at least one loop antenna surrounding the one or more photo cells.

Embodiment 17. The transponder of a Transponder Embodiment, comprising encoding such that number of cycles committed to transmitting a one bit is 8 data periods.

Embodiment 18. The transponder of a Transponder Embodiment, comprising encoding such that number of cycles committed to transmitting a one bit is 64 data periods.

Embodiment 19. A transponder comprising: (A) a monolithic integrated circuit sized about 2 mm or less×2 mm or less×0.2 mm (thickness) or less; and (B) a reversible antenna system comprising one or more antennas and a plurality of electronic switches, the antennas and switches configured to conduct a bi-phase transmission to direct current flows through the antennas and the plurality of electronic switches, optionally with one or more features of Embodiment 1 or 9.

Embodiment 20. The transponder of a Transponder Embodiment, wherein the bi-phase transmission is conducted such that a "1" bit digital signal is transmitted with a first current flow through an antenna in one direction and a "0" bit digital signal is transmitted with a second current flow in an opposite direction in the antenna.

Embodiment 21. The transponder of a Transponder Embodiment, wherein the antennas comprise a forward antenna and a reverse antenna.

Embodiment 22. The transponder of a Transponder Embodiment, wherein the antenna system comprises a single antenna.

Embodiment 23. The transponder of a Transponder Embodiment, wherein the reversible antenna system is configured to conduct the bi-phase transmission to transmit transmitted a "1" bit digital signal and a "0" bit digital signal with substantially the same power.

Embodiment 24. The transponder of a Transponder Embodiment, wherein the one or more antennas are loop antennas surrounding one or more photo cells.

Embodiment 25. A security inlay, comprising: (1) a bottom inlay segment; (2) a top inlay segment configured to fit to the bottom inlay segment; and (3) an electromagnetic radiation triggered transponder, comprising a top side and a bottom side, seated between the two inlay segments, the bottom side being disposed on the bottom inlay segment and the top side being disposed onto the top inlay segment, wherein the security inlay is configured so that a separation of the top inlay segment from the bottom inlay segment breaks the electromagnetic radiation triggered transponder such that the transponder cannot be read, optionally with one or more features of Embodiment 32.

Embodiment 26. The security inlay of a Security Inlay Embodiment, wherein the transponder includes a notch configured to direct a line of cleavage of the transponder such that operative electronics are compromised.

Embodiment 27. The security inlay of a Security Inlay Embodiment, wherein the bottom inlay segment includes a bottom groove configured to accommodate glue to adhere to the bottom side of the transponder, and the top inlay segment has a top groove configured to accommodate glue to adhere to the top side of the transponder.

Embodiment 28. The security inlay of a Security Inlay Embodiment, wherein the bottom groove and the top groove are located on opposite sides of the notch, respectively.

Embodiment 29. The security inlay of a Security Inlay Embodiment, wherein the top side and the bottom side of the transponder respectively comprise adhesive disposed on non-adjacent respective portions of the top side and the bottom side of the transponder.

Embodiment 30. The security inlay of a Security Inlay Embodiment, wherein the two segments are configured to not be readily separable when manipulated prior to being adhered to an object in need of a security inlay.

Embodiment 31. A method of securing an object comprising adhering the security inlay of a Security Inlay Embodiment via the bottom inlay segment to the object, and adhering to the bottom inlay segment to a tape or capsule that provides closure for the object.

Embodiment 32. A monolithic security inlay, comprising: (a) an inlay segment; and (b) an electromagnetic radiation triggered microtransponder (MTP) coupled to the inlay segment and comprising at least one monolithic security self-destructive feature, optionally with one or more features of Embodiment 25.

Embodiment 33. The monolithic security inlay of a Security Inlay Embodiment 2, wherein the MTP is directly attached to or cast into a mold label configured to be attached to a physical object.

Embodiment 34. The monolithic security inlay of a Security Inlay Embodiment, wherein the MTP is directly attached to or cast into a mold label with subsequent formation of a physical object on or around the mold label containing the MTP.

Embodiment 35. The monolithic security inlay of a Security Inlay Embodiment, wherein at least one monolithic security self-destructive feature is configured to transport the MTP to or across an external structure feature to disable the MTP.

Embodiment 36. The monolithic security inlay of a Security Inlay Embodiment, wherein at least one monolithic security self-destructive feature is configured to rotate or engage a foreign object or structure to make contact with the MTP which is then incapacitated from induced stress.

Embodiment 37. A method of securing an object, comprising: (1) embedding at least two microtransponders (MTPs) into a taggant, a plurality of taggants, a packaging, or the object, or a combination thereof to generate at least one legitimate matched pair, the MTPs each being configured with respective identifiers; (2) indexing the respective identifiers of the MTPs to the object; (3) storing indexing information associated with the MTPs and the object in a database of a digital security system; (4) reading the respective identifiers via an identifier reader; and (5) verifying, based on the reading, the indexing information to determine whether the respective identifiers are associated to the legitimate matched pair, optionally with one or more features of Embodiment 41.

Embodiment 38. The method of securing the object of a Securing Embodiment, wherein at least one legitimate matched pair is associated with at least two different MTPs embedded into the taggant, the plurality of taggants, the packaging, or the object, or the combination thereof.

Embodiment 39. The method of securing the object of a Securing Embodiment, wherein each MTP comprises: (a) one or more photo cells configured to receive light; (b) a clock recovery circuit comprising a photoconductor, the photoconductor comprising a source terminal, and a drain terminal coupled to a power source, the photoconductor having a resistance configured to vary as a function of received light intensity, the clock recovery circuit configured to generate a recovered clock; and (c) a reverse antenna system connected to at least one photo cell and configured to transmit data.

Embodiment 40. The method of securing the object of a Securing Embodiment, wherein each MTP is embodied with at least one monolithic security self-destructive feature.

Embodiment 41. A method of securing an object, comprising: (I) embedding or attaching at least one microtransponder (MTP) and at least one taggant to an object to generate at least one legitimate matched pair, the MTP and taggant each being configured with respective identifiers; (II) indexing the respective identifiers of the MTP and taggant to the object; (III) storing indexing information associated with the MTP and taggant and the object in a database of a digital security system; (IV) reading the respective identifiers via an identifier reader; and (V) verifying, based on the reading, the indexing information to determine whether the respective identifiers are associated to the legitimate matched pair, optionally with one or more features of Embodiment 37.

Embodiment 42. The method of a Securing Embodiment, wherein the at least one taggant includes a QR code, barcode, RFID tag, or combination thereof.

Embodiment 43. The method of a Securing Embodiment, wherein the embedding or attaching is performed to place the at least one MTP and at least one taggant next to one another or at different locations on the surface of the object or within the object.

Embodiment 44. The method of a Securing Embodiment, wherein the embedding or attaching is performed to combine the at least one MTP and at least one taggant into a single compound security marking.

Embodiment 45. A method for authenticating a physical item, comprising: (1) configuring a super anchor with a first identifier, the super anchor comprising an electromagnetic radiation triggered microtransponder (MTP); (2) registering and storing, by a processor of a server computing device, the first identifier associated with the physical item indexed to a first item number stored in a database of a digital security system, the super anchor device being embedded in a taggant attached to the physical item, the database being configured to store a plurality of identifiers and a plurality of item numbers indexed to respective physical items; (3) illuminating the super anchor device with an identifier reader; (4) receiving and decoding, by the identifier reader, a response signal from the super anchor to obtain a second identifier associated with the physical item; and (5) determining, based on the second identifier by the processor of a server computing device, whether the physical item is authenticated, optionally with one or more features of Embodiment 49.

Embodiment 46. The method of an Authenticating Embodiment, wherein determining whether the physical item is authenticated further comprising: determining whether the second identifier is registered in the database; and in response to determining that the second identifier is registered in the database, determining whether the second identifier matches a first identifier indexed to the item number of the physical item.

Embodiment 47. The method of an Authenticating Embodiment, wherein determining whether the physical item is authenticated further comprising: in response to determining that the second identifier matches a first identifier indexed to the item number of the physical item, displaying an authentic message on the identifier reader.

Embodiment 48. The method of an Authenticating Embodiment, wherein the MTP is embedded into a substrate of the taggant in a multilayer manufacturing process.

Embodiment 49. A method for authenticating a physical item, comprising: (a) configuring a super anchor with at least one microtransponder (MTP) and at least one taggant to an object to generate at least one legitimate matched pair, the MTP and taggant each being configured with respective first and second identifiers; (b) registering and storing, by a processor of a server computing device, the first and second identifiers associated with the physical item indexed to a first item number stored in a database of a digital security system, the database being configured to store a plurality of identifiers and a plurality of item numbers indexed to respective physical items; (c) illuminating the super anchor device with an identifier reader; (d) receiving and decoding, by the identifier reader, a response signal from the super anchor to obtain a third identifier associated with the physical item; (e) reading the super anchor device with a taggant reader; (0 receiving and decoding, by the taggant reader, a response signal from the super anchor to obtain a fourth identifier associated with the physical item; and (g) determining, based on the third and fourth identifiers by the processor of a server computing device, whether the physical item is authenticated, optionally with one or more features of Embodiment 45.

Embodiment 50. The method of an Authenticating Embodiment, wherein determining whether the physical item is authenticated further comprising:

determining whether the third and fourth identifiers are registered in the database; and in response to determining that the third and fourth identifiers are registered in the database, determining whether the third and fourth identifiers match the respective first identifier and second identifier indexed to the item number of the physical item.

Embodiment 51. The method of an Authenticating Embodiment, wherein determining whether the physical item is authenticated further comprising:

in response to determining that the third and fourth identifiers match the respective first and second identifiers indexed to the item number of the physical item, displaying an authentic message on the identifier reader or the taggant reader.

Embodiment 52. A system of generating a secure document smart contract, comprising: (1) a plurality of super anchors, each super anchor comprising an electromagnetic radiation triggered microtransponder (MTP) with an identifier, each MTP being linked to respective identifier and registered in a security system; (2) a smart paper embedded with at least one super anchor with first identifier; (3) a smart paper container embedded with a second super anchor with a second identifier; (4) an authorized print device registered in a security system and embedded with a third MTP with a third identifier; and (5) an identifier reader registered in the security system with a reader identifier, wherein the identifier reader is incorporated into the authorized print device and configured to read the first super anchor to obtain the first identifier and the second super anchor to obtain the second identifier, optionally with one or more features of Embodiment 64.

Embodiment 53. The system of a System Embodiment, wherein the authorized print device is configured to: (i) receive secure document content and print instructions from a user over a network; and (ii) generate a printed article for the secure document smart contract based on the secure document content and print instructions;

Embodiment 54. The system of a System Embodiment, wherein the authorized print device is in communication with a processor configured to execute a hash function to generate respective hash values associated with the secure document smart contract; and wherein the respective hash values are stored in a blockchain secure archive and linked to the secure document smart contract in a blockchain secure archive for printing article authentication.

Embodiment 55. The system of a System Embodiment, wherein the respective hash values are associated with the first identifier of the smart paper and the second identifier of the smart paper container.

Embodiment 56. The system of a System Embodiment, wherein the respective hash values are associated with the first identifier of the smart paper, the second identifier of the smart paper container, a third identifier of the authorized print device, and the reader identifier.

Embodiment 57. The system of a System Embodiment, wherein the authorized print device is a 3D print device.

Embodiment 58. The system of a System Embodiment, wherein the first identifier of the smart paper is configured to include a material lot number of the smart paper.

Embodiment 59. The system of a System Embodiment, wherein the second identifier of the smart paper container is exchanged with or configured to include a container product number of the smart paper container.

Embodiment 60. The system of a System Embodiment, wherein the MTP is manufactured in a process to eliminate the eddy currents for enhancing a MTP read distance.

Embodiment 61. The system of a System Embodiment, wherein the process includes applying an active or passive monolithic layer to MTP wafer by liquid, gel or solid media followed by thermal or radiation curing in a field of polysilazane/polysiloxane chemistry.

Embodiment 62. The system of a System Embodiment, wherein the passive monolithic layer includes glass or a filled glass structure.

Embodiment 63. The system of a System Embodiment, wherein the smart paper further includes a 2D security mark, an RFID tag, or a combination thereof.

Embodiment 64. A system of generating a secure smart contract, comprising: (a) a plurality of super anchors, each super anchor comprising an electromagnetic radiation triggered microtransponder (MTP) with an identifier, each MTP being linked to respective identifier and registered in a security system; (b) at least one super anchor with a first identifier; (c) an authorized 3D print device registered in a security system and embedded with a second MTP with a second identifier, wherein the 3D printer is configured to: (i) receive secure content and print instructions from a user over a network; and (ii) generate a 3D printed article for the secure smart contract based on the secure document content and print instructions; and (d) an identifier reader registered in the security system with a reader identifier, wherein the identifier reader is incorporated into the authorized print device and configured to read at least the first super anchor to obtain the first identifier, optionally with one or more features of Embodiment 52.

Embodiment 65. The system of a System Embodiment, wherein the 3D printed article includes the first super anchor and 2D laser marks.

Embodiment 66. The system of a System Embodiment, wherein the 3D printed article includes the first super anchor without 2D laser marks.

Embodiment 67. A method for monitoring a continuous medium, comprising: (1) configuring a super anchor with a first identifier, the super anchor comprising an electromagnetic radiation triggered microtransponder (MTP); (2) dispersing the super anchor in the continuous medium; (3) illuminating the super anchor device with an identifier reader at a first time when the super anchor is at a first position within the continuous medium; (4) receiving and decoding, by the identifier reader, a first response signal from the super anchor; (5) in response to the first response signal, storing first data indicative of the first time and the first position; (6) illuminating the super anchor device with the identifier reader at a second time when the super anchor is at a second position within the continuous medium; (7) receiving and decoding, by the identifier reader, a second response signal from the super anchor; (8) in response to the second response signal, storing second data indicative of the second time and the second position; and (9) processing the first data and the second data to determine at least one fluid characteristic of the continuous medium.

While the foregoing is directed to embodiments of the present invention, other and further embodiments of the invention may be devised without departing from the basic scope thereof, and the scope thereof is determined by the claims that follow.

Publications and references, including but not limited to patents and patent applications, cited in this specification are herein incorporated by reference in their entirety in the entire portion cited as if each individual publication or reference were specifically and individually indicated to be incorporated by reference herein as being fully set forth. Any patent application to which this application claims priority is also incorporated by reference herein in the manner described above for publications and references.

Although some embodiments have been discussed above, other implementations and applications are also within the scope of the following claims. Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the following claims. More specifically, those of skill will recognize that any embodiment described herein that those of skill would recognize could advantageously have a sub-feature of another embodiment, is described as having that sub-feature.

What is claimed is:

1. A taggant comprising:
   a two-dimensional code; and
   a microtransponder (MTP) embedded within the two-dimensional code, the MTP comprising one or more light-triggered photocells and being associated with an identifier.

2. The taggant of claim 1 comprising a plurality of layers, wherein the MTP is embedded within at least one of the plurality of layers.

3. The taggant of claim 1, wherein the two-dimensional code comprises a printed code, a laser marked code, or a laser etched code.

4. The taggant of claim 1, comprising a plurality of layers, wherein the two-dimensional code is printed, laser marked, or laser etched on at least one of the plurality of layers.

5. The taggant of claim 1, wherein the two-dimensional code is printed on a substrate with the embedded MTP.

6. The taggant of claim 5, wherein the substrate comprises at least one of natural paper, synthetic paper, film, cardboard, plastic, metal, wood, and composite.

7. The taggant of claim 1, wherein the identifier is indexed to an object on which taggant is affixed.

8. The taggant of claim 1, wherein the one or more light-triggered photocells are configured to receive light, and wherein the MTP further comprises:
   a clock recovery circuit configured to generate a recovered clock.

9. The taggant of claim 1, wherein the MTP is embodied with at least one monolithic security self-destructive feature.

10. A package with a taggant comprising:
    a two-dimensional code; and
    a microtransponder (MTP) embedded within the two-dimensional code, the MTP comprising one or more light-triggered photocells and associated with an identifier.

11. The package of claim 10, wherein the taggant comprises a plurality of layers, and wherein the MTP is embedded within a least one of the plurality of layers.

12. The package of claim 10, wherein the two-dimensional code comprises a printed code, a laser marked code, or a laser etched code.

13. The package of claim 10, wherein the taggant comprises a plurality of layers, and wherein the two-dimensional code is printed, laser marked, or laser etched on at least one of the plurality of layers.

14. The package of claim 10, wherein the two-dimensional code is printed on a substrate with the embedded MTP.

15. The package of claim 14, wherein the substrate comprises at least one of natural paper, synthetic paper, film, cardboard, plastic, metal, wood, and composite.

16. The package of claim 10, wherein the identifier is indexed to the package.

17. The package of claim 10, wherein the one or more light-triggered photocells are configured to receive light, and wherein the MTP further comprises:
    a clock recovery circuit configured to generate a recovered clock.

18. The package of claim 10, wherein the MTP is embodied with at least one monolithic security self-destructive feature.

* * * * *